United States Patent
Kanno

(10) Patent No.: US 10,776,153 B2
(45) Date of Patent: *Sep. 15, 2020

(54) INFORMATION PROCESSING DEVICE AND SYSTEM CAPABLE OF PREVENTING LOSS OF USER DATA

(71) Applicant: TOSHIBA MEMORY CORPORATION, Tokyo (JP)

(72) Inventor: Shinichi Kanno, Ota Tokyo (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 16/387,127

(22) Filed: Apr. 17, 2019

(65) Prior Publication Data

US 2019/0243679 A1 Aug. 8, 2019

Related U.S. Application Data

(63) Continuation of application No. 15/684,848, filed on Aug. 23, 2017, now Pat. No. 10,372,481.

(30) Foreign Application Priority Data

Mar. 15, 2017 (JP) .................. 2017-049903

(51) Int. Cl.
 *G11C 14/00* (2006.01)
 *G06F 9/46* (2006.01)
 (Continued)

(52) U.S. Cl.
 CPC .............. *G06F 9/463* (2013.01); *G06F 1/263* (2013.01); *G06F 1/30* (2013.01); *G06F 3/061* (2013.01);
 (Continued)

(58) Field of Classification Search
 CPC ...................................... G11C 14/00
 (Continued)

(56) References Cited

U.S. PATENT DOCUMENTS 10,372,481 B2 * 8/2019 Kanno ............... G06F 3/065
2009/0158000 A1 6/2009 Takahashi
(Continued)

FOREIGN PATENT DOCUMENTS

JP 2009-289014 A 12/2009
JP 5259257 B2 8/2013

OTHER PUBLICATIONS

Taiwan Notice of Allowance dated May 10, 2018, mailed in Taiwan counterpart Application No. 106122911, 6 pages (with translation).

*Primary Examiner* — Hoai V Ho
(74) *Attorney, Agent, or Firm* — Kim & Stewart LLP

(57) ABSTRACT

An information processing device connectable to a plurality of storage devices includes a power source circuit configured to supply power from a backup power source to each of the plurality of storage devices in response to a power loss event, and a processor. The processor is configured to transmit, to each of the storage devices, a first instruction to save user data that have been transmitted to the storage device and have not been written in a non-volatile manner, in response to the power loss event, and transmit, to at least one of the storage devices, a second instruction to save updated address translation information that corresponds to the user data and has not been reflected in an address translation table, upon receiving a response indicating completion of saving the user data from each of the storage devices.

9 Claims, 20 Drawing Sheets

(51) Int. Cl.
  *G06F 3/06* (2006.01)
  *G06F 1/30* (2006.01)
  *G06F 1/26* (2006.01)
  *H04W 52/02* (2009.01)

(52) U.S. Cl.
  CPC ............ *G06F 3/065* (2013.01); *G06F 3/0688* (2013.01); *G11C 2211/5641* (2013.01); *H04W 52/02* (2013.01)

(58) Field of Classification Search
  USPC .................................................. 365/185.08
  See application file for complete search history.

(56) References Cited

U.S. PATENT DOCUMENTS

| | | | |
|---|---|---|---|
| 2014/0089585 A1 | 3/2014 | Nakajima et al. | |
| 2015/0143032 A1 | 5/2015 | Hashimoto | |
| 2015/0254186 A1 | 9/2015 | Sugimoto et al. | |
| 2016/0034221 A1 | 2/2016 | Zettsu et al. | |
| 2016/0070336 A1 | 3/2016 | Kojima et al. | |
| 2016/0291887 A1 | 10/2016 | Gole et al. | |
| 2017/0046260 A1* | 2/2017 | Umeda | G06F 11/1446 |
| 2017/0060706 A1* | 3/2017 | Kinoshita | G06F 11/1666 |

* cited by examiner

FIG. 5

| BLK | | | | |
|---|---|---|---|---|
| d1 | d2 | d3 | d4 | LBA1~4 |
| d5 | d6 | d7 | d8 | LBA5~8 |
| d9 | d10 | d11 | d12 | LBA9~12 |
| d13 | d14 | d15 | d16 | LBA13~16 |
| d17 | d18 | d19 | d20 | LBA17~20 |
| d21 | d22 | d23 | d24 | LBA21~24 |
| d25 | d26 | d27 | d28 | LBA25~28 |
| LBA LIST | | | | |

(Page0–7)

FIG. 7

| BLK | | | | |
|---|---|---|---|---|
| Page0 d1 | d2 | d3 | d4 | LBA1~4 |
| 1 d5 | d6 | d7 | d8 | LBA5~8 |
| 2 d9 | d10 | d11 | d12 | LBA9~12 |
| 3 d13 | d14 | padding | padding | LBA13,14 |
| 4 padding | padding | padding | padding | padding |
| 5 padding | padding | padding | padding | padding |
| 6 padding | padding | padding | padding | padding |
| 7 LBA LIST | | | | |

*FIG. 16*

RECONSTRUCTION OF ADDRESS TRANSLATION TABLE

| | |
|---|---|
| LBA1 | OLD PHYSICAL ADDRESS → NEW PHYSICAL ADDRESS (BLK11, Page0, offset0) |
| LBA2 | OLD PHYSICAL ADDRESS → NEW PHYSICAL ADDRESS (BLK11, Page0, offset1) |
| LBA3 | OLD PHYSICAL ADDRESS → NEW PHYSICAL ADDRESS (BLK11, Page0, offset2) |
| LBA4 | OLD PHYSICAL ADDRESS → NEW PHYSICAL ADDRESS (BLK11, Page0, offset3) |
| LBA5 | OLD PHYSICAL ADDRESS → NEW PHYSICAL ADDRESS (BLK11, Page1, offset0) |
| LBA6 | OLD PHYSICAL ADDRESS → NEW PHYSICAL ADDRESS (BLK11, Page1, offset1) |
| LBA7 | OLD PHYSICAL ADDRESS → NEW PHYSICAL ADDRESS (BLK11, Page1, offset2) |
| LBA8 | OLD PHYSICAL ADDRESS → NEW PHYSICAL ADDRESS (BLK11, Page1, offset3) |
| LBA9 | OLD PHYSICAL ADDRESS → NEW PHYSICAL ADDRESS (BLK11, Page2, offset0) |
| LBA10 | OLD PHYSICAL ADDRESS → NEW PHYSICAL ADDRESS (BLK11, Page2, offset1) |
| LBA11 | OLD PHYSICAL ADDRESS → NEW PHYSICAL ADDRESS (BLK11, Page2, offset2) |
| LBA12 | OLD PHYSICAL ADDRESS → NEW PHYSICAL ADDRESS (BLK11, Page2, offset3) |
| LBA13 | OLD PHYSICAL ADDRESS → NEW PHYSICAL ADDRESS (BLK11, Page3, offset0) |
| LBA14 | OLD PHYSICAL ADDRESS → NEW PHYSICAL ADDRESS (BLK11, Page3, offset1) |
| LBA15 | OLD PHYSICAL ADDRESS → NEW PHYSICAL ADDRESS (BLK11, Page3, offset2) |
| LBA16 | OLD PHYSICAL ADDRESS → NEW PHYSICAL ADDRESS (BLK11, Page3, offset3) |
| ⋮ | ⋮ |
| LBA21 | OLD PHYSICAL ADDRESS → NEW PHYSICAL ADDRESS (BLK12, Page0, offset0) |
| LBA22 | OLD PHYSICAL ADDRESS → NEW PHYSICAL ADDRESS (BLK12, Page0, offset1) |
| LBA23 | OLD PHYSICAL ADDRESS → NEW PHYSICAL ADDRESS (BLK12, Page0, offset2) |
| LBA24 | OLD PHYSICAL ADDRESS → NEW PHYSICAL ADDRESS (BLK11, Page0, offset3) |
| ⋮ | ⋮ |

ABSTRACT# INFORMATION PROCESSING DEVICE AND SYSTEM CAPABLE OF PREVENTING LOSS OF USER DATA

CROSS-REFERENCE TO RELATED APPLICATIONS

This application is a continuation of U.S. patent application Ser. No. 15/684,848, filed on Aug. 23, 2017, which is based upon and claims the benefit of priority from Japanese Patent Application No. 2017-049903, filed on Mar. 15, 2017, the entire contents of each of which are incorporated herein by reference.

FIELD

Embodiments described herein relate generally to an information processing device, a storage device, and an information processing system.

BACKGROUND

An information processing device such as a server computer including a plurality of storage devices, e.g., solid-state drives (SSDs) or hard disk drives (HDDs), is being improved to have better input and output capabilities.

Storage devices of many types have a power loss protection (PLP) function. Such storage devices having the PLP function include a capacitor in order to prevent a loss of user data caused by an unexpected power loss such as a blackout.

However, inclusion of the capacitor in each of the storage devices leads to an undesirable cost increase.

DESCRIPTION OF THE DRAWINGS

FIG. 5 illustrates a relationship between user data and LBAs written in the same page within a block within a non-volatile memory and an LBA list written in a specific page within the block.

FIG. 7 illustrates a relationship between user data and LBAs written in the same page within the block within the non-volatile memory through the first storage operation and the LBA list written in the specific page within the block.

FIG. 16 illustrates an operation for reconstructing an address translation table.

DETAILED DESCRIPTION

An embodiment provides an information processing device, a storage device, and an information processing system capable of preventing a loss of user data.

In general, according to an embodiment, an information processing device connectable to a plurality of storage devices includes a power source circuit configured to supply power from a backup power source to each of the plurality of storage devices in response to a power loss event, and a processor. The processor is configured to transmit, to each of the storage devices, a first instruction to save user data that have been transmitted to the storage device and have not been written in a non-volatile manner, in response to the power loss event, and transmit, to at least one of the storage devices, a second instruction to save updated address translation information that corresponds to the user data and has not been reflected in an address translation table, upon receiving a response indicating completion of saving the user data from each of the storage devices.

Hereinafter, embodiments will be described with reference to the drawings.

Figure 1:
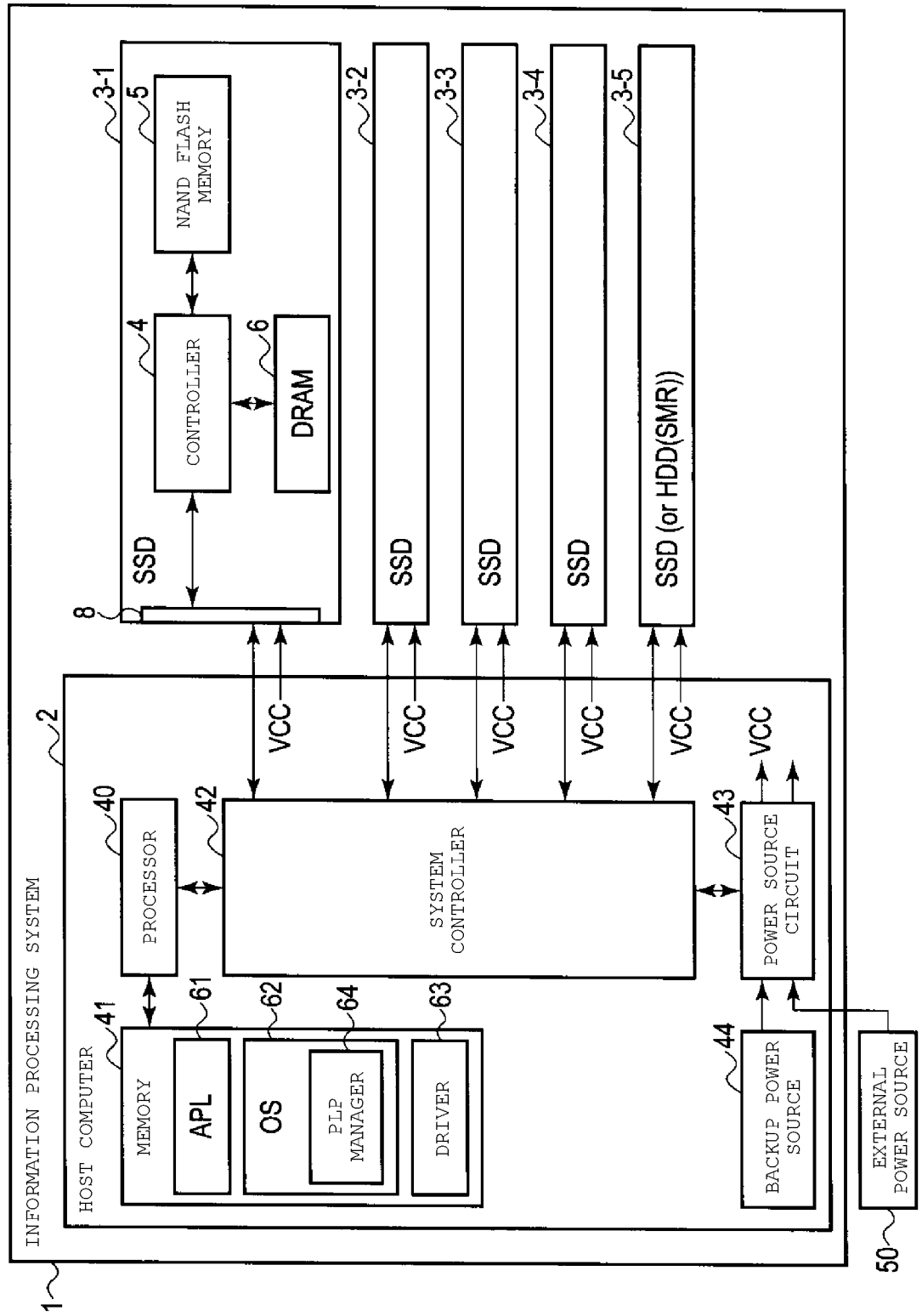
FIG. 1 is a block diagram of an information processing system according to an embodiment.

Initially, a configuration of an information processing system 1 including an information processing device according to an embodiment will be described with reference to FIG. 1.

The information processing system 1 includes a host computer (also referred to as a host device or simply as a host) 2, and a plurality of storage devices 3-1, 3-2, 3-3, 3-4, and 3-5. The host computer 2 is an information processing device (e.g., computing device) that accesses the plurality of storage devices 3-1, 3-2, 3-3, 3-4, and 3-5. The host computer 2 may be a storage server that stores various kinds of massive data in the plurality of storage devices 3-1, 3-2, 3-3, 3-4, and 3-5, or may be a personal computer.

Each of the storage devices 3-1, 3-2, 3-3, 3-4, and 3-5 may be built in the information processing device functioning as the host computer 2, or may be connected to the information processing device through a cable.

SCSI, Serial Attached SCSI (SAS), ATA, Serial ATA (SATA), PCI Express® (PCIe), Ethernet®, Fibre Channel, or NVM Express® (NVMe) may be used as an interface for mutually connecting the host computer 2 and the storage devices 3-1, 3-2, 3-3, 3-4, and 3-5.

Each of the storage devices 3-1, 3-2, 3-3, 3-4, and 3-5 includes a volatile memory such as DRAM, and a non-volatile storage medium, and manages mapping of logical addresses and physical addresses of the non-volatile storage medium by using an address translation table. The volatile memory is used as a write buffer that temporarily stores write data from the host computer 2. In order to access the address translation table within the non-volatile storage medium at a high speed, at least a part of the address translation table is loaded to the volatile memory from the non-volatile storage medium. When data corresponding to a certain logical address is written in the non-volatile storage medium, the address translation table retained in the volatile memory is updated such that a physical address indicating a physical storage position of the non-volatile storage medium in which this data is written maps to this logical address. The updated address translation information is written back in the non-volatile storage medium later. Accordingly, the updated content of the address translation information is reflected on the address translation table within the non-volatile storage medium.

An example of the storage device includes a NAND flash technology-based solid-state drive (SSD), and a hard disk drive (HDD) using a shingled magnetic recording (SMR) technology. In the following description, each of the storage devices 3-1, 3-2, 3-3, 3-4, and 3-5 is configured with the SSD, but these storage devices may be anyone of HDDs using the SMR technology.

The SSD 3-1 includes a controller 4, and a non-volatile memory (e.g., NAND flash memory) 5. The SSD 3-1 may include a random-access memory, for example, a DRAM 6. The DRAM 6 functions as the volatile memory, and the NAND flash memory 5 functions as the non-volatile storage medium. The SSD 3-1 further includes a connector 8 for connecting to the host computer 2.

The NAND flash memory 5 includes a memory cell array including a plurality of memory cells arranged in a matrix configuration. The NAND flash memory 5 may be a two-dimensional NAND flash memory, or may be a three-dimensional NAND flash memory. The controller 4 manages mapping of logical addresses and physical addresses of the NAND flash memory 5 by using the address translation table. The address translation table is also referred to as a logical-to-physical address translation table.

The SSD 3-1 is operated with power VCC supplied from the host computer 2 through the connector 8. The SSDs 3-2 to 3-5 have the same configuration as that of the SSD 3-1. In the present embodiment, when an event of an unexpected power loss such as a blackout occurs, backup power is supplied to the SSDs 3-1 to 3-5 from the host computer 2 only for a certain limited period. Thus, the SSDs 3-1 to 3-5 do not need to include a capacitor for power loss protection (PLP).

The host computer 2 includes a processor (CPU) 40, a memory 41, a system controller 42, a power source circuit 43, and a backup power source 44.

The processor 40 is a CPU configured to control operations of components of the host computer 2. The processor 40 executes various programs to be loaded to the memory 41 from any one of the plurality of SSDs 3-1 to 3-5. The memory 41 is a random-access memory such as DRAM. A program executed by the processor 40 includes various application program (APL) 61, an operating system (OS) 62, and a device driver 63 that controls the SSDs 3-1 to 3-5.

The OS 62 may include a PLP manager 64. The PLP manager 64 causes various commands for safely protecting user data of all the SSDs 3-1 to 3-5 when the event of the unexpected power loss such as the blackout occurs. The amount of backup power capable of being supplied from the host computer 2 is limited. Accordingly, when the storing of metadata (e.g., updated address translation information) is started without any condition after some SSDs of the SSDs 3-1 to 3-5 complete the storing of the user data, a larger amount of power is accordingly consumed by some SSDs. In this case, there is a possibility that the backup power from the host computer 2 will be discontinued before other SSDs complete the storing of the user data. As a result, some of the user data may be lost or destroyed.

In order to prevent some of the user data from being lost or destroyed, the processor 40 performs the following processes by executing a command group of the PLP manager 64.

The processor 40 respectively transmits first storage instructions to the SSD 3-1 to 3-5 after the event of the power loss occurs. The first storage instruction is to instruct the SSDs 3-1 to 3-5 to store user data which have not been written in the NAND flash memory 5 in the NAND flash memory 5 from the DRAM 6. Each SSD stores only the user data in the NAND flash memory 5, and does not performs an operation for storing the updated address translation information in the NAND flash memory 5.

When replies indicating completion of the storing of the user data in the NAND flash memory 5 are received from all SSDs 3-1 to 3-5, the processor 40 transmits second storage instructions to all SSDs 3-1 to 3-5 or one or more of the SSDs 3-1 to 3-5. The second storage instruction instructs each SSD to store the updated address translation information which indicates the updated content of the address translation table and has not been written in the NAND flash memory 5 in the NAND flash memory 5 from the DRAM 6. Each SSD that receives the second storage instruction stores the updated address translation information in the NAND flash memory 5. Accordingly, it is possible to maintain the address translation table for accessing the NAND flash memory 5 at a high speed in the latest state. Thus, in the SSD that stores the updated address translation information in the NAND flash memory 5, it is not necessary to reconstruct the address translation table when power is recovered. Accordingly, the SSD that stores the updated address translation information in the NAND flash memory 5 may enter a normal operable state immediately after the power from the host computer 2 is recovered.

In a case where the second storage instructions are transmitted to one or more SSDs of the SSDs 3-1 to 3-5, the processor 40 may transmit the second storage instructions to only one or more SSDs that require a longer time through the reconstruction of the address translation table. When the replies indicating completion of the storing of the updated address translation information are received from all one or more SSDs, the processor 40 may transmit the second storage instruction to the remaining SSDs. Accordingly, it is possible to guarantee that the SSD that requires a longer time through the reconstruction of the address translation table completes the storing of the updated address translation information. In doing so, it is possible to shorten a time required when all the SSDs 3-1 to 3-5 are recovered to a normal operation state from when the power is recovered.

Alternatively, in a case where the second storage instructions are transmitted to one or more SSDs of the SSDs 3-1 to 3-5, the processor 40 may select one or more SSDs that store data having a high access frequency or one or more SSDs that store user data each having a higher degree of importance, and may transmit the second storage instructions to the one or more selected SSDs. When the replies indicating the completion of the storing of the updated address translation information are received from all of the one or more SSDs, the processor 40 may transmit the second storage instruction to the remaining SSDs. Accordingly, it is possible to recover the SSD that stores the data having a high access frequency or the user data having a higher degree of importance to the normal operation state at a higher speed.

The system controller 42 functions as a controller configured to control various peripheral devices. The system controller 42 may include an SAS expander, a PCIe switch, a PCIe expander, a flash array controller, or a RAID controller.

The power source circuit 43 is connected to an external power source 50 and the backup power source 44. The power source circuit 43 switches the power source from the external power source 50 to the backup power source 44 in response to the event of the unexpected power loss such as a blackout, and supplies backup power to components within the host computer 2 and the SSDs 3-1 to 3-5 by using power from the backup power source 44. The power source circuit 43 monitors power-source voltage supplied from the external power source 50, and detects that the power loss event occurs when the power-source voltage is decreased. When the power loss event occurs, the power source circuit 43 may notify the processor 40 that the power loss event occurs by generating an interrupt signal for the processor 40.

Figure 2:
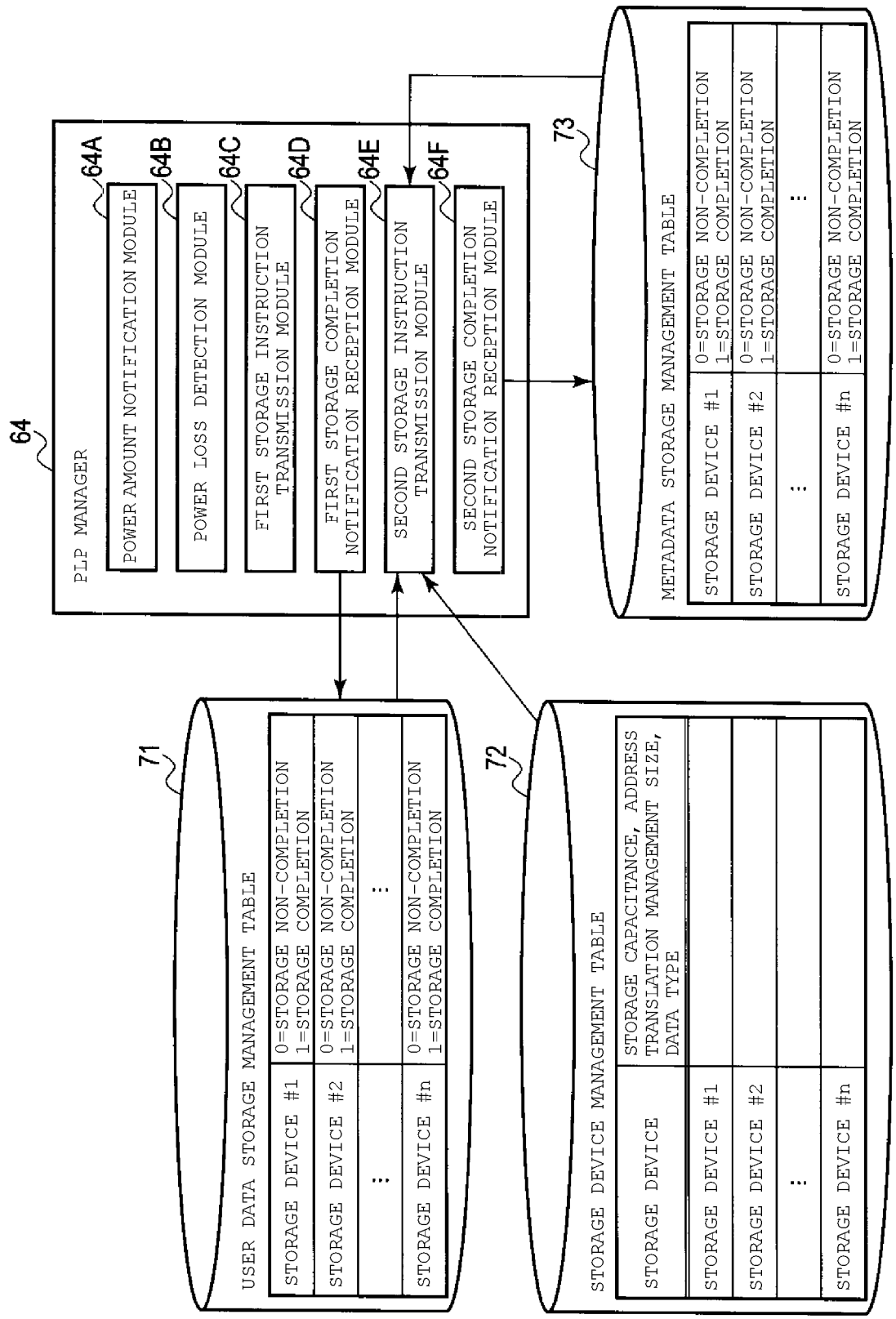
FIG. 2 illustrates a configuration example of a PLP manager of a host computer within the information processing system according to the embodiment.

FIG. 2 shows a configuration example of the PLP manager 64.

The PLP manager 64 includes a power amount notification module 64A, a power loss detection module 64B, a first storage instruction transmission module 64C, a first storage completion notification reception module 64D, a second storage instruction transmission module 64E, and a second storage completion notification reception module 64F.

The power amount notification module 64A includes a command group for notifying the SSDs 3-1 to 3-5 of the amount of power (in particular, amount of backup power) capable of being supplied after the power loss event occurs for a normal operation period before the unexpected power loss event occurs. For example, the amount of power capable of being supplied after the power loss event occurs indicates the amount of power capable of being supplied for each SSD. The amount of power may be different among the individual SSDs. For example, a larger amount of power may be supplied to the SSD having high power consumption. The amount of power may be expressed by power [W] per unit time and a time during which power is able to be supplied.

The power loss detection module 64B includes a command group for detecting the event of the unexpected power loss by communicating with the power source circuit 43.

The first storage instruction transmission module 64C includes a command group for transmitting the first storage instructions to the SSDs 3-1 to 3-5. The first storage completion notification reception module 64D includes a command group for receiving the replies indicating that the storing of the user data is completed from the SSDs 3-1 to 3-5 and registering statuses indicating whether the storing of the user data is completed or is not completed in a user data storage management table 71. The user data storage management table includes a plurality of entries that respectively corresponds to the plurality of storage devices (in this example, SSDs). A value "0" indicating that the storing of the user data is not completed or a value "1" indicating that the storing of the user data is completed is set in each entry.

The second storage instruction transmission module 64E includes a command group for determining whether or not the replies indicating that the storing of the user data is completed are received from all SSDs 3-1 to 3-5 and a command group for transmitting the second storage instructions to all SSDs 3-1 to 3-5 or at least one of the SSDs 3-1 to 3-5 by referring to the user data storage management table 71. The SSD to which the second storage instruction is to be transmitted is determined based on the content of a storage device management information table 72. The storage device management information table 72 includes a plurality of entries that respectively corresponds to the plurality of storage devices (in this example, SSDs). A storage capacitance of the corresponding storage device, an address translation management size, a data type, a storage device type, and the like are registered in the entries. The address translation management size indicates a management size for logical-to-physical address translation. For example, an address translation management size of a storage device preferred to manage the mapping of the logical addresses and the physical addresses for every 4 kilobytes is 4 kilobytes. The data type indicates the degree of importance of the user data stored in the corresponding storage device. Alternatively, the data type may be a statistical value indicating an access frequency.

In the present embodiment, the second storage instructions may be preferentially transmitted to one or more SSDs that require a longer time through the reconstruction of the address translation table. In general, the larger the storage capacitance is, the larger a necessary size of the address translation table is. The smaller the management size for logical-to-physical address translation is, the larger the necessary size of the address translation table is. Accordingly, the second storage instruction transmission module 64E may include a command group for selecting one or more SSDs that require a longer time through the reconstruction of the address translation table from the SSDs 3-1 to 3-5 based on at least one of the storage capacitance and the address translation management size.

The second storage instructions may be preferentially transmitted to one or more SSDs that store the user data each having a high degree of importance. In this case, the second storage instruction transmission module 64E may include a command group for selecting one or more SSDs that store the user data each having a high degree of importance from the SSDs 3-1 to 3-5 based on the degree of importance of the user data indicated by the data type.

The second storage instructions may be preferentially transmitted to one or more SSDs that store the user data having a high access frequency.

The second storage completion notification reception module 64F includes a command group for receiving replies indicating that the storing of the updated address translation information is completed from the SSDs 3-1 to 3-5 and registering statuses indicating whether the storing of the metadata is completed or is not completed in metadata storage management table 73. The metadata storage management table 73 includes a plurality of entries that respectively corresponds to the plurality of storage devices (in this example, SSDs). A value "0" indicating that the storing of the metadata is not completed or a value "1" indicating that the storing of the metadata is completed is set in each entry.

The second storage instruction transmission module 64E may include a command group for determining whether or not the replies indicating that the storing of the metadata is completed are received from all of several SSDs to which the second storage instructions are preferentially transmitted and a command group for transmitting the second storage instructions to the remaining SSDs when the replies indicating that the storing of the metadata is completed are received from all of the several SSDs to which the second storage instructions are preferentially transmitted by referring to the metadata storage management table 73.

Figure 3:
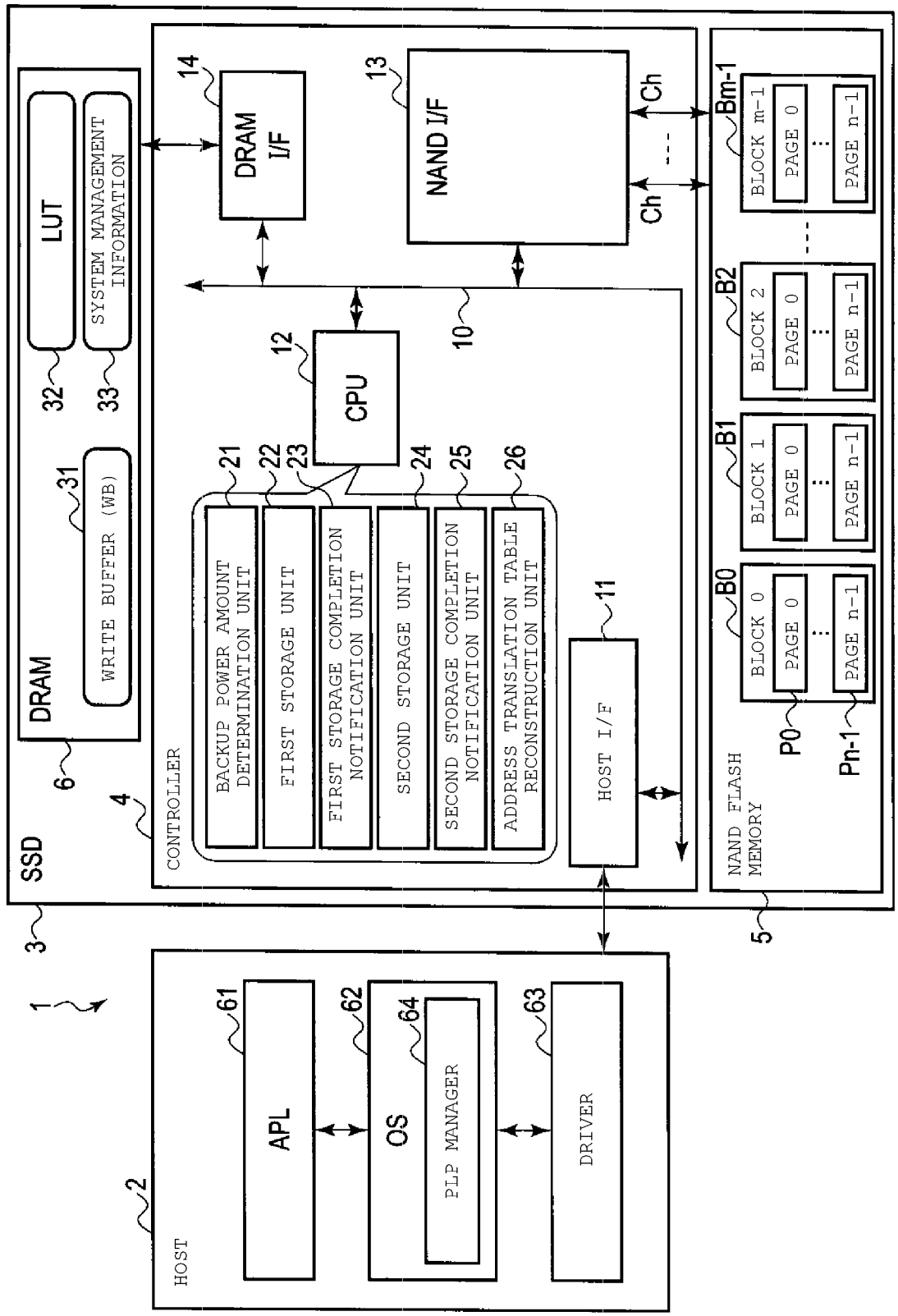
FIG. 3 is a block diagram of an SSD within the information processing system according to the embodiment.

FIG. 3 shows a configuration example of the SSD 3-1.

Other SSDs have the same configuration as that of the SSD 3-1.

As described above, the SSD 3-1 includes the controller 4, the NAND flash memory 5, and the DRAM 6.

The memory cell array of the NAND flash memory 5 includes a plurality of blocks B0 to Bm−1. Each of the blocks B0 to Bm−1 includes a plurality of pages (page P0 to Pn−1 in this example). The blocks B0 to Bm−1 function as erase units. The blocks are also referred to as "erase blocks" or are simply referred to as "physical blocks". Each of pages P0 to Pn−1 includes a plurality of memory cells connected to the same word line. Each of the pages P0 to Pn−1 is a unit on which a data write operation and a data read operation is performed.

The blocks B0 to Bm−1 have a limited number of erase cycles. The erase cycles may be expressed by the program/erase cycles. One program/erase cycle of a certain block includes an erasing operation for setting all memory cells within the block to be in an erase state, and a write operation (also referred to as a program operation) for writing data in the pages of this block.

The controller 4 is electrically connected to the NAND flash memory 5 which is the non-volatile memory through a NAND interface 13 such as Toggle or Open NAND Flash Interface (ONFI). The NAND interface 13 functions as a NAND control circuit configured to control the NAND flash memory 5. The NAND flash memory 5 may include a plurality of NAND flash memory chips. In this case, the NAND interface 13 may be connected to the NAND flash memory chips through the plurality of channels Ch. One or more NAND flash memory chips are connected to one channel.

The controller 4 may function as a flash translation layer (FTL) configured to perform the data management and block management of the NAND flash memory 5. The data management performed by the FTL includes (1) a management of mapping information indicating a correspondence between the logical addresses and the physical addresses of the NAND flash memory 5, and (2) a process for concealing the read/write operation on the page basis and the erasing operation based on the block basis. The logical address is an address used by the host computer 2 in order to designate the address of the SSD 3-1. A logical block address (LBA) may be used as the logical address.

The management of the mapping of the logical addresses and the physical addresses is performed by using a lookup table (LUT) 32 functioning as the logical-to-physical address translation table. The controller 4 manages the mapping of the logical addresses and the physical addresses based on a predetermined management size unit by using the lookup table (LUT) 32. A physical address corresponding to a certain logical address indicates a latest physical storage position within the NAND flash memory 5 in which the data of the logical address is written. The address translation table (LUT 32) may be loaded to the DRAM 6 from the NAND flash memory 5 when the SSD 3 is powered on.

The data writing for the page may be performed one time per one erase cycle. Thus, the controller 4 writes update data corresponding to a certain logical address in a different physical storage position other than a physical storage position in which previous data corresponding to this logical address is stored. The controller 4 updates the lookup table (LUT) 32. The controller associates this logical address with the different physical storage position, and invalidates the previous data.

The block management includes the management of bad blocks, the wear leveling, and garbage collection. Wear leveling is an operation for leveling degrees of wear of the blocks. In the garbage collection, in order to increase the number of free blocks in which data are able to be written, valid data within several target blocks that retain valid data and invalid data together are moved to another block (for example, free block). In the present embodiment, the valid data means data that is (that is, data associated as latest data from the logical address) referred to in the LUT 32 and is likely to be read from the host computer 2 later. The invalid data means data which is not likely to be read from the host computer 2. For example, data associated with a certain logical address is valid data, and data which is not associated with any logical address is invalid data.

The controller 4 updates the lookup table (LUT) 32, and maps the logical addresses of the moved valid data to the physical addresses of the moving destinations. The valid data are moved to different blocks, and thus, the blocks in which only invalid data are present is released as the free blocks. Accordingly, the block may be reused after the erasing operation is performed.

The controller 4 may include a host interface 11, a CPU 12, the NAND interface 13, and a DRAM interface 14. The CPU 12, the NAND interface 13, and the DRAM interface 14 may be connected to each other through a bus 10.

The host interface 11 receives various commands (for example, a write command, a read command, an UNMAP/Trim command, a command for the first storage instruction, and a command for the second storage instruction) from the host computer 2. The write command includes a logical address (e.g., start LBA) and a transmission length of the write data. The read command includes a logical address (e.g., start LBA) indicating an initial logical block of the data to be read and a data length.

The CPU 12 is a processor configured to control the host interface 11, the NAND interface 13, and the DRAM interface 14. The CPU 12 performs various processes by loading a control program (e.g., firmware) stored in the NAND flash memory 5 onto the DRAM 6 in response to the powered-on of the SSD 3 and performing the firmware. For example, the CPU 12 may perform a command process for processing various commands from the host computer 2 in addition to the FTL process. An operation of the CPU 12 is controlled by the firmware executed by the CPU 12. A part or all of the FTL process and the command process may be performed by dedicated hardware within the controller 4.

The CPU 12 may function as a backup power amount determination unit 21, a first storage unit 22, a first storage completion notification unit 23, a second storage unit 24, a second storage completion notification unit 25, and an address translation table reconstruction unit 26.

When a notification indicating the amount of power capable of being supplied after the event of the power loss is received from the host computer 2 for the normal operation period, the backup power amount determination unit 21 restricts the amount of unwritten user data capable of being accumulated in the write buffer (WB) 31 within the DRAM 6 and the amount of unwritten updated address translation information (that is, the amount of dirty data capable of being retained within the lookup table (LUT) 32) capable of being accumulated in the DRAM 6 based on the amount of power notified. The dirty data is a set of updated physical addresses corresponding to the logical addresses. The backup power amount determination unit 21 determines whether or not the user data are able to be stored with the amount of power notified, that is, whether or not the amount of power notified is the amount of sufficient power necessary to store the user data. The backup power amount determination unit 21 returns a message indicating the determination result to the host computer 2. When the amount of power notified does not satisfy the amount of power necessary to store the user data, the backup power amount determination unit 21 returns a notification indicating that the user data are not able to be stored to the host computer 2. The PLP manager 64 of the host computer 2 may adjust the supply of the amount of power to the SSDs 3-1 to 3-5 such that all the SSDs 3-1 to 3-5 are able to store at least the user data based on the messages from the SSDs 3-1 to 3-5.

The first storage unit 22 stores the user data within the write buffer (WB) 31 which is not written in the NAND flash memory 5 in the NAND flash memory 5, and completes the uncompleted writing when the first storage instruction is received from the host computer 2. The first storage unit 22 may store both the user data and the address information for reconstructing the address translation table in the NAND flash memory 5. The address information includes a logical address corresponding to the user data in order to allow the reconstruction of the address translation table. The first storage unit 22 may read user data corresponding to one page from the write buffer (WB) 31, and may write the user data and address information (one or more logical addresses corresponding to the user data) corresponding to the user data in the same page. Each page may include a user data area and a redundant area. In this case, the user data corresponding to one page are written in the user data area within the page, and the one or more logical address are written in the redundant area within the page.

When the storing of all user data within the write buffer (WB) 31 which have not been written in the NAND flash memory 5 is completed, the first storage completion notification unit 23 notifies the host computer 2 of the completion of the storing of the user data.

When the second storage instruction is received from the host computer 2, the second storage unit 24 stores the updated address translation information (dirty data within the lookup table (LUT) 32) which has not been written in the NAND flash memory 5 in the NAND flash memory 5, and reflects the updated address translation information on the address translation table within the NAND flash memory 5. When the storing of all the updated address translation information which has not been written in the NAND flash memory 5 is completed, the second storage completion notification unit 25 notifies the host computer 2 of the completion of the storing of the updated address translation information.

When the power from the host computer 2 is recovered from the power loss, the address translation table reconstruction unit 26 reconstructs the address translation table by using the address information written in each page. When all updated address translation information is reflected on the address translation table within the NAND flash memory 5, it is not necessary to reconstruct the address translation table.

Figure 4:
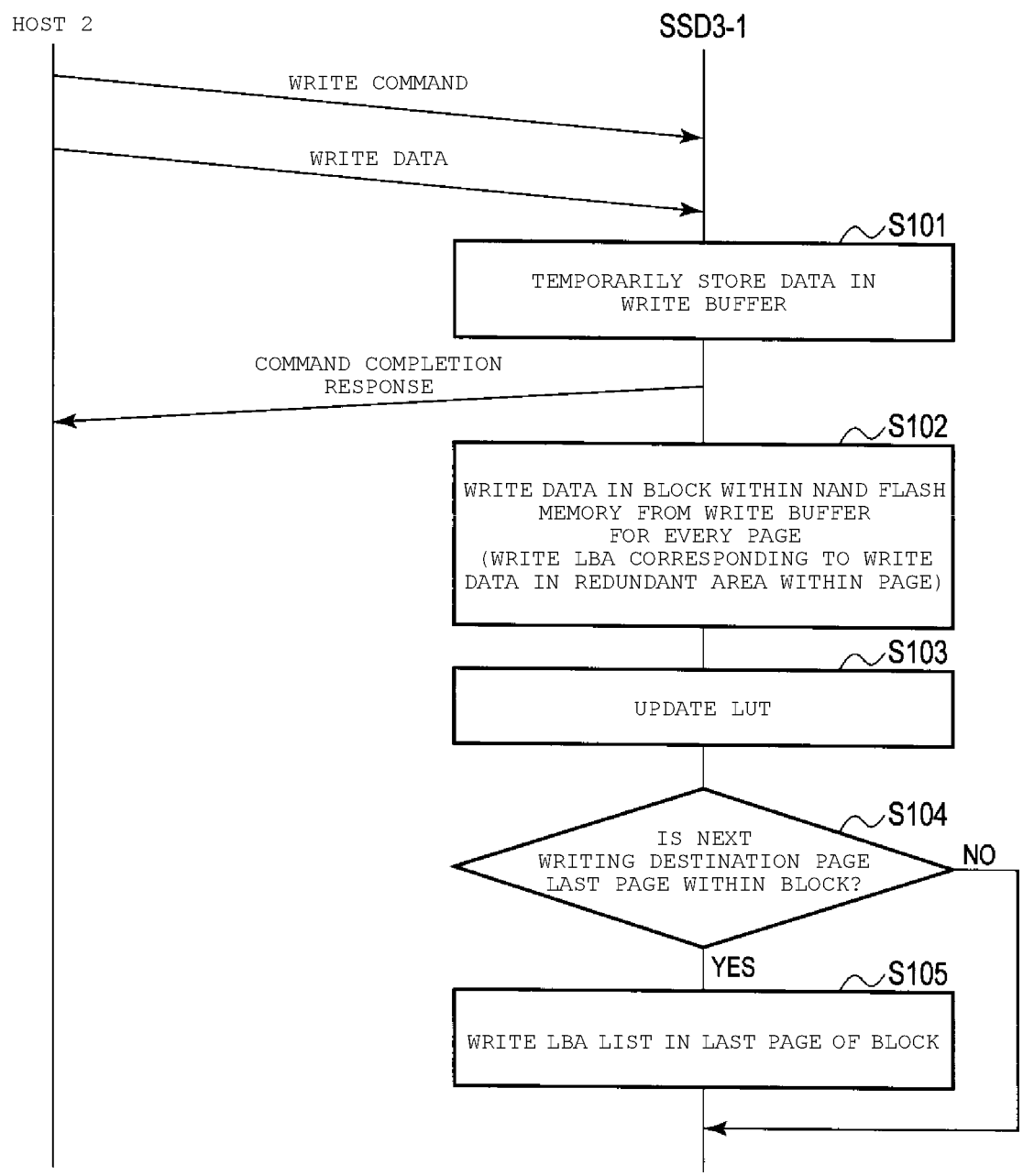
FIG. 4 illustrates a process sequence of a write operation performed by the host computer and the SSD.

FIG. 4 shows a process sequence of a write operation performed by the host computer 2 and the SSD 3-1.

When the SSD 3-1 receives the write command from the host computer 2 and receives write data from the host computer 2, the SSD 3-1 temporarily stores the received write data in the write buffer (WB) 31 (step S101). When the write data is stored in the write buffer 31, the SSD 3-1 returns a response indicating the command completion to the host computer 2.

Subsequently, the SSD 3-1 writes the write data within the write buffer 31 in the block within the NAND flash memory 5 for every page (step S102). In this case, the SSD 3-1 writes the logical address (LBA) corresponding to the write data in the redundant area within the page, as the address information for the reconstruction of the address translation table. That is, the SSD 3-1 writes the write data as much as one page and the LBAs corresponding to the write data as much as one page in the same page.

When the write data is written, the SSD 3-1 updates the address translation table (LUT) 32, and maps the physical address indicating the physical storage position in which the write data is written to the LBA corresponding to the write data (step S103).

Thereafter, the SSD 3-1 determines whether or not a writing destination page next to the page in which the write data is written in step S102 is the last page within the block (step S104). When the writing destination page next to the page in which the write data is written is the last page within the block (YES of step S104), the SSD 3-1 may write an LBA list in the last page of the block (step S105). The LBA list is additional address information for allowing the reconstruction of the address translation table at a high speed. The LBA list written in the last page of a certain block is a set of LBAs that respectively correspond to the user data written in the pages within the block.

FIG. 5 shows the relationship between user data and LBAs written in the same page within a block within the NAND flash memory 5 and an LBA list written in a specific page within the block.

In FIG. 5, it is assumed that a block BLK includes eight pages (pages 0 to 7) for simplicity of illustration. Also, it is assumed that a size of the user data area of each page is 16 kilobytes and a management size for the logical-to-physical address translation is 4 kilobytes.

On page 0, data d1, data d2, data d3, and data d4 are written in the user data area, and LBAs 1 to 4 are written in the redundant area. The LBAs 1 to 4 are the logical addresses corresponding to the data d1 to d4.

On page 1, data d5, data d6, data d7, and data d8 are written in the user data area, and LBAs 5 to 8 are written in the redundant area. The LBAs 5 to 8 are the logical addresses corresponding to the data d5 to d8.

On page 2, data d9, data d10, data d11, and data d12 are written in the user data area, and LBAs 9 to 12 are written in the redundant area. The LBAs 9 to 12 are the logical addresses corresponding to the data d9 to d12.

On page 3, data d13, data d14, data d15, and data d16 are written in the user data area, and LBAs 13 to 16 are written in the redundant area. The LBAs 13 to 16 are the logical addresses corresponding to the data d13 to d16.

On page 4, data d17, data d18, data d19, and data d20 are written in the user data area, and LBAs 17 to 20 are written in the redundant area. The LBAs 17 to 20 are the logical addresses corresponding to the data d17 to d20.

On page 5, data d21, data d22, data d23, and data d24 are written in the user data area, and LBAs 21 to 24 are written in the redundant area. The LBAs 21 to 24 are the logical addresses corresponding to the data d21 to d24.

On page 6, data d25, data d26, data d27, and data d28 are written in the user data area, and LBAs 25 to 28 are written in the redundant area. The LBAs 25 to 28 are the logical addresses corresponding to the data d25 to d28.

The LBA list may be written in the last page of the block, that is, page 7 of FIG. 5. The LBA list includes the LBAs 1 to 28 corresponding to the data d1 to d28. The writing destination page of the LBA list may not be necessarily the last page of the block.

Figure 6:
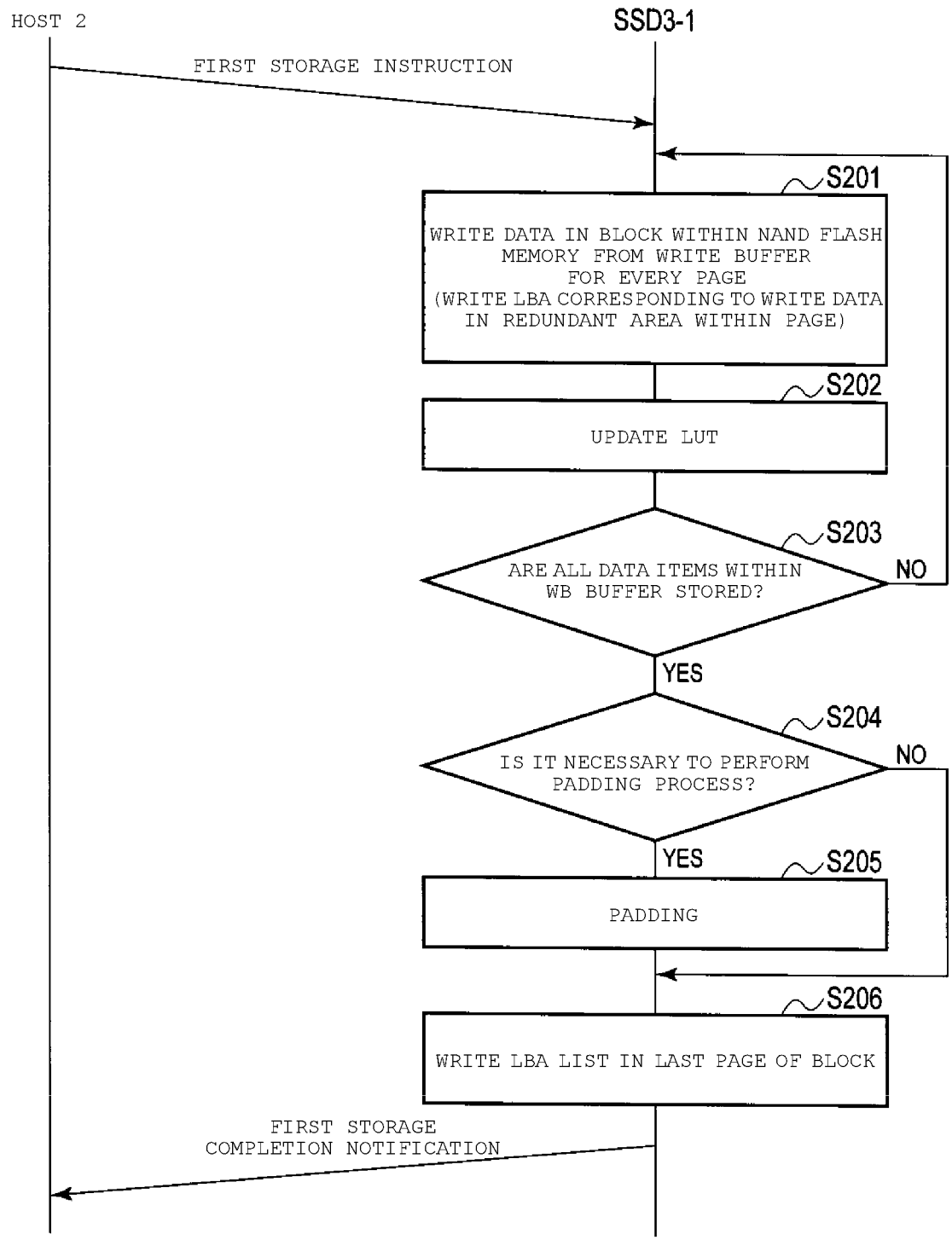
FIG. 6 illustrates a process sequence of a first storage operation performed by the SSD within the information processing system according to the embodiment.

FIG. 6 shows a process sequence of a first storage operation performed by the SSD 3-1.

When the SSD 3-1 receives the first storage instruction from the host computer 2, the SSD 3-1 writes the write data within the write buffer 31 which have not been written in the NAND flash memory 5 in the writing destination block within the NAND flash memory 5 for every page (step S201). In this case, the SSD 3-1 writes the logical address (LBA) corresponding to the write data in the redundant area within the page, as the address information for the reconstruction of the address translation table. That is, the SSD 3-1 writes the write data of one page and the LBAs corresponding to the write data of one page in the same page.

When the write data is written in the writing destination block, the SSD 3-1 updates the address translation table (LUT) 32, and maps the physical address indicating the physical storage position in which the write data is written to the LBA corresponding to the write data (step S202).

Subsequently, the SSD 3-1 determines whether or not the storing of all unwritten write data in the NAND flash memory 5 from the write buffer 31 is completed (step S203). The processes of step S201 and S202 are repeated until the storing of all unwritten write data in the NAND flash memory 5 from the write buffer 31 is completed.

When the storing of all unwritten write data is completed (step S204), the SSD 3-1 determines whether or not a padding process for filling the current writing destination block with the data is necessary (step S204). When an empty area in which the data is not written is present in the current writing destination block, the SSD determines that the padding process is necessary.

When it is determined that the padding process is necessary (YES of step S204), the SSD 3-1 writes dummy data in the empty area of the current writing destination block (step S205). The SSD 3-1 writes the LBA list in the last page of the current writing destination block (step S206).

When the writing of the LBA list is completed, the SSD 3-1 transmits a first storage completion notification indicating that the storing of the user data is completed to the host computer 2.

FIG. 7 shows the relationship between user data and LBAs written in the same page within a block BLK within the NAND flash memory 5 through the first storage operation and an LBA list written in a specific page within this block.

In FIG. 7, it is assumed that the write data within the write buffer 31 which are not written in the NAND flash memory 5 are data d1 to d14. Similarly to the case described in FIG. 5, it is assumed that the block BLK includes eight pages (pages 0 to 7), the size of the user data area of each page is 16 kilobytes, and the management size for the logical-to-physical address translation is 4 kilobytes.

On page 0, data d1, data d2, data d3, and data d4 are written in the user data area, and LBAs 1 to 4 corresponding to the data d1 to d4 are written in the redundant area.

On page 1, data d5, data d6, data d7, and data d8 are written in the user data area, and LBAs 5 to 8 corresponding to the data d5 to d8 are written in the redundant area.

On page 2, data d9, data d10, data d11, and data d12 are written in the user data area, and LBAs 9 to 12 corresponding to the data d9 to d12 are written in the redundant area.

On page 3, data d13 and data d14 are written in the user data area, and LBAs 13 and 14 corresponding to the data d13 and d14 are written in the redundant area. Dummy data are written in the remaining areas within the user data area of the page 3 (as part of the padding process). The LBAs corresponding to the dummy data are not written in the redundant area of the page 3.

On pages 4 to 6, since the data to be written are not present in the write buffer 31, the dummy data are written in the user data area and redundant area (as part of the padding process). Accordingly, it is possible to fill the pages 0 to 6 of the block BLK with the data. When the dummy data are not written, there is a possibility that the writing of the data in the empty areas in the erase state within the writing destination block BLK will not be performed for a long time. In such a case, there is a possibility that the reliability of the empty areas in the erase state is deteriorated.

The LBA list may be written in the page 7 (which is the last page of the block).

Figure 8:
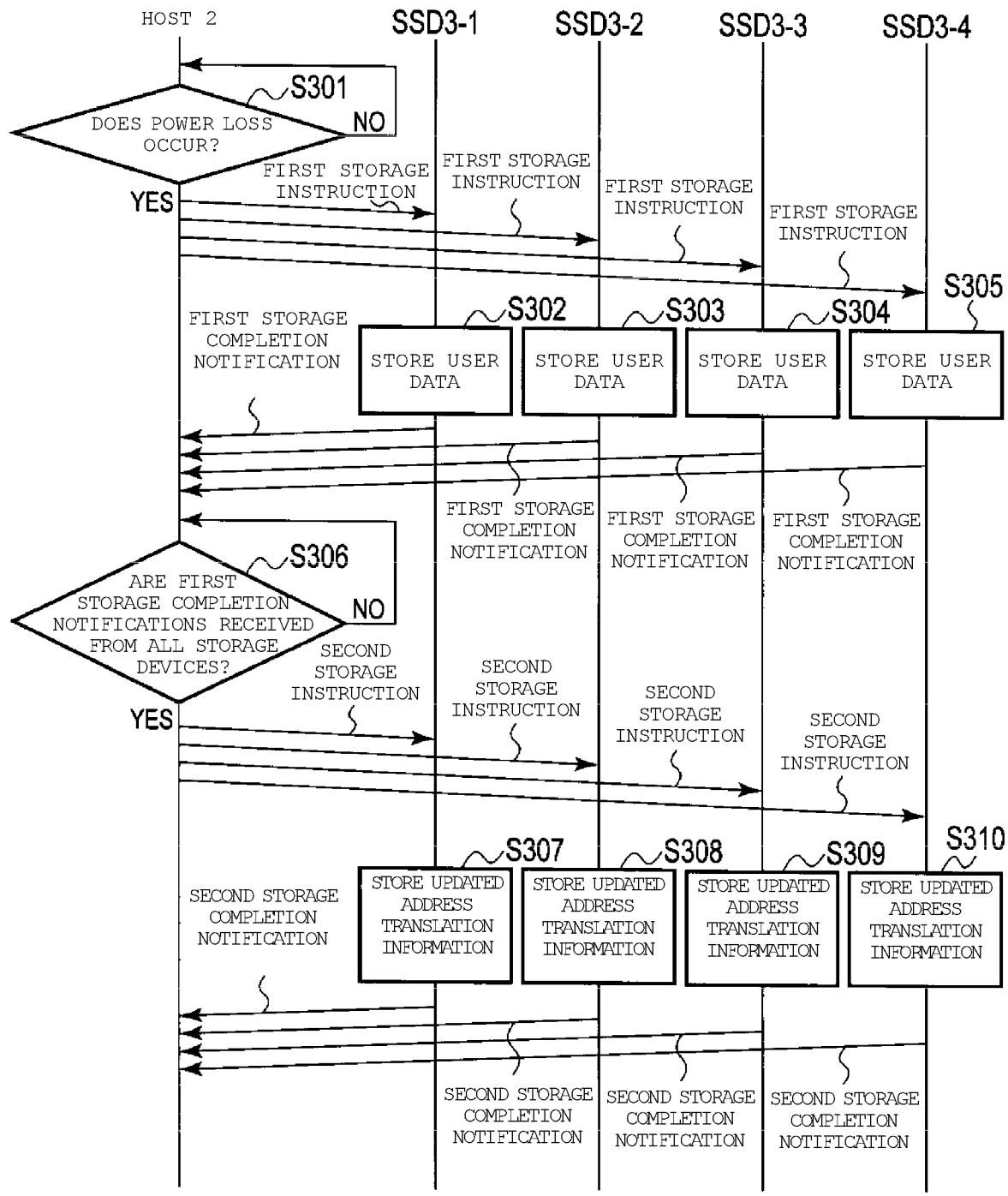
FIG. 8 illustrates a process sequence of a first storage operation and a second storage operation performed by the host computer and a plurality of SSDs.

FIG. 8 shows a first storage operation and a second storage operation performed by the host computer 2 and the SSDs 3-1 to 3-4.

The processor 40 of the host computer 2 determines whether or not the event of the unexpected power loss such as the blackout occurs (step S301). When the event of the unexpected power loss occurs (YES of step S301), the processor 40 transmits the first storage instruction to the SSDs 3-1 to 3-4.

When the first storage instruction is received, the controller 4 of the SSD 3-1 stores the user data within the write buffer (WB) 31 which have not been written in the NAND flash memory 5 in the NAND flash memory 5 (step S302). When the storing of the user data is completed, the controller 4 of the SSD 3-1 transmits the first storage completion notification indicating that the storing of the user data is completed to the host computer 2.

Similarly, when the SSD 3-2 receives the first storage instruction, the user data which have not been written in the NAND flash memory 5 within the SSD 3-2 is stored in the NAND flash memory 5 (step S303). When the storing of the user data is completed, the SSD 3-2 transmits the first storage completion notification indicating that the storing of the user data is completed to the host computer 2.

Similarly, when the SSD 3-3 receives the first storage instruction, the user data which have not been written in the NAND flash memory 5 within the SSD 3-3 is stored in the NAND flash memory 5 (step S304). When the storing of the user data is completed, the SSD 3-3 transmits the first storage completion notification indicating that the storing of the user data is completed to the host computer 2.

Similarly, when the SSD 3-4 receives the first storage instruction, the user data which have not been written in the NAND flash memory 5 within the SSD 3-4 is stored in the NAND flash memory 5 (step S305). When the storing of the user data is completed, the SSD 3-4 transmits the first storage completion notification indicating that the storing of the user data is completed to the host computer 2.

The processor 40 of the host computer 2 determines whether or not the first storage completion notifications are received from all storage devices (in this example, SSDs 3-1 to 3-4) to which the first storage instructions are transmitted (step S306). When the first storage completion notifications are received from all storage devices to which the first storage instructions are transmitted (YES of step S306), the processor 40 transmits the second storage instructions to all SSDs 3-1 to 3-4 or at least one SSD of the SSDs 3-1 to 3-4. In FIG. 8, an example in which the second storage instructions are transmitted to all SSDs 3-1 to 3-4 is illustrated.

When the second storage instruction is received, the controller 4 of the SSD 3-1 stores the updated address translation information which is not written in the NAND flash memory 5 in the NAND flash memory 5 (step S307). When the storing of the updated address translation information is completed, the controller 4 of the SSD 3-1 transmits the second storage completion notification indicating that the storing of the updated address translation information is completed to the host computer 2.

Similarly, when the SSD 3-2 receives the second storage instruction, the updated address translation information which is not written in the NAND flash memory 5 within the SSD 3-2 is stored in the NAND flash memory 5 (step S308). When the storing of the updated address translation information is completed, the SSD 3-2 transmits the second storage completion notification indicating that the storing of the updated address translation information is completed to the host computer 2.

Similarly, when the SSD 3-3 receives the second storage instruction, the updated address translation information which has not been written in the NAND flash memory 5 within the SSD 3-3 is stored in the NAND flash memory 5 (step S309). When the storing of the updated address translation information is completed, the SSD 3-3 transmits the second storage completion notification indicating that the storing of the updated address translation information is completed to the host computer 2.

Similarly, when the SSD 3-4 receives the second storage instruction, the updated address translation information which has not been written in the NAND flash memory 5 within the SSD 3-4 is stored in the NAND flash memory 5 (step S310). When the storing of the updated address translation information is completed, the SSD 3-4 transmits the second storage completion notification indicating that the storing of the updated address translation information is completed to the host computer 2.

Figure 9:
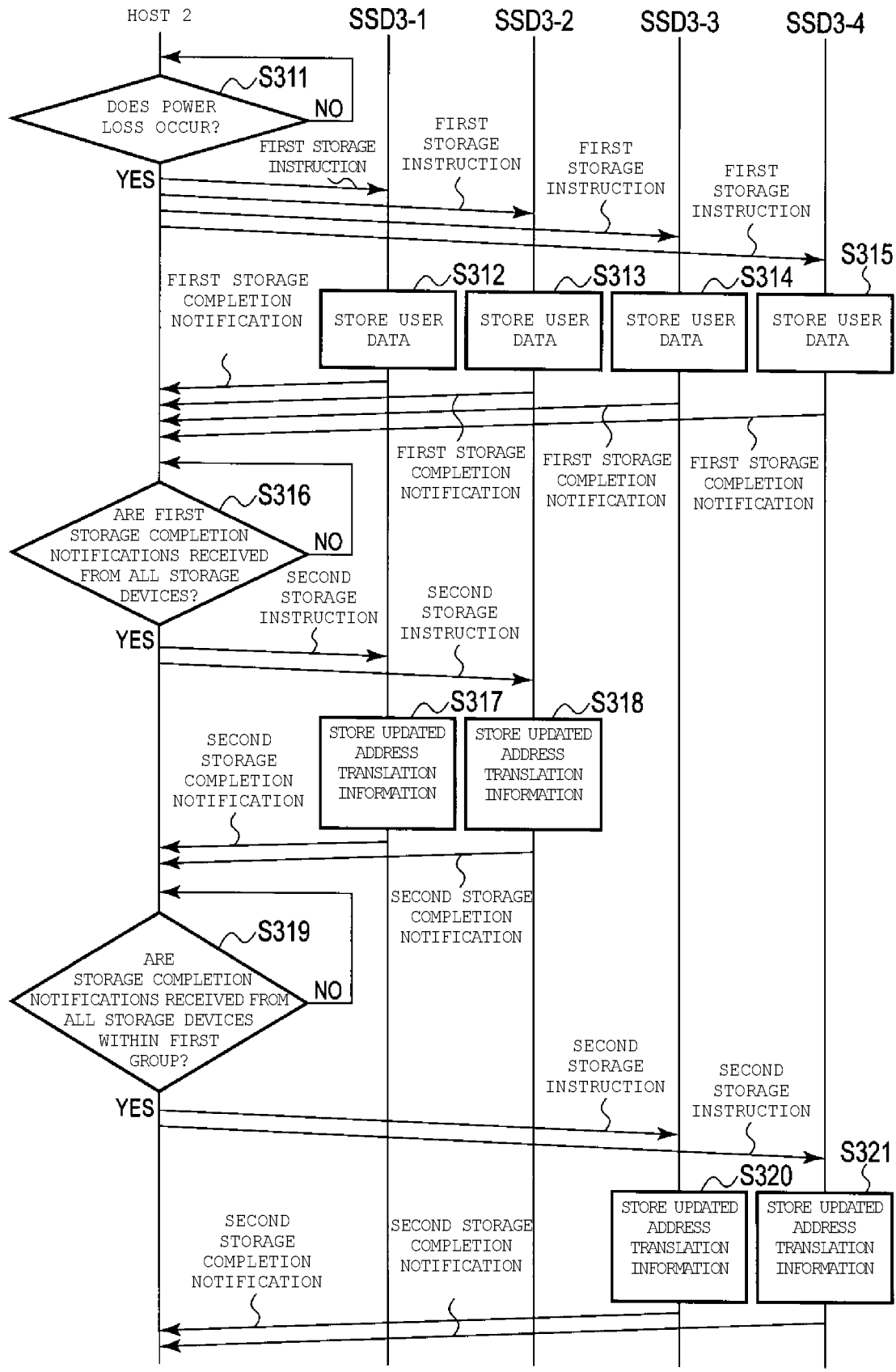
FIG. 9 illustrates another process sequence of the first storage operation and the second storage operation performed by the host computer and the plurality of SSDs.

FIG. 9 shows another process sequence of the first storage operation and the second storage operation performed by the host computer 2 and the SSDs 3-1 to 3-4.

The processor 40 of the host computer 2 determines whether or not the event of the unexpected power loss such as the blackout occurs (step S311). When the event of the unexpected power loss occurs (YES of step S311), the processor 40 transmits the first storage instructions to the SSDs 3-1 to 3-4.

When the first storage instruction is received, the controller 4 of the SSD 3-1 stores the user data within the write buffer (WB) 31 which have not been written in the NAND flash memory 5 in the NAND flash memory 5 (step S312). When the storing of the user data is completed, the controller 4 of the SSD 3-1 transmits the first storage completion notification indicating that the storing of the user data is completed to the host computer 2.

Similarly, when the SSD 3-2 receives first storage instruction, the user data which have not been written in the NAND flash memory 5 within the SSD 3-2 is stored in the NAND flash memory 5 (step S313). When the storing of the user data is completed, the SSD 3-2 transmits the first storage completion notification indicating that the storing of the user data is completed to the host computer 2.

Similarly, when the SSD 3-3 receives first storage instruction, the user data which have not been written in the NAND flash memory 5 within the SSD 3-3 is stored in the NAND flash memory 5 (step S314). When the storing of the user data is completed, the SSD 3-3 transmits the first storage completion notification indicating that the storing of the user data is completed to the host computer 2.

Similarly, when the SSD 3-4 receives first storage instruction is received, the user data which have not been written in the NAND flash memory 5 within the SSD 3-4 is stored in the NAND flash memory 5 (step S315). When the storing of the user data is completed, the SSD 3-4 transmits the first storage completion notification indicating that the storing of the user data is completed to the host computer 2.

The processor 40 of the host computer 2 determines whether or not the first storage completion notifications are received from all storage devices (in this example, SSDs 3-1 to 3-4) to which the first storage instructions are transmitted (step S316). When the first storage completion notifications are received from all storage devices to which the first storage instructions are transmitted (YES of step S316), the processor 40 transmits the second storage instructions to all SSDs 3-1 to 3-4 or at least one SSD of the SSDs 3-1 to 3-4. In FIG. 9, the second storage instructions are transmitted to only one or more SSDs (in this example, SSD 3-1 and SSD 3-2) belonging to a first group. For example, the SSD belonging to the first group is an SSD of which a time necessary to reconstruct the address translation table is longer than that of another SSD. The second storage instructions are preferentially transmitted to several SSDs belonging to the first group, and thus, it is possible to shorten a time necessary when all the SSDs are recovered to the normal operation state from when the power is recovered.

The processor 40 of the host computer 2 transmits the second storage instructions to the SSD 3-1 and the SSD 3-2.

When the second storage instruction is received, the controller 4 of the SSD 3-1 stores the updated address translation information which is not written in the NAND flash memory 5 in the NAND flash memory 5 (step S317). When the storing of the updated address translation information is completed, the controller 4 of the SSD 3-1 transmits the second storage completion notification indicating that the storing of the updated address translation information is completed to the host computer 2.

Similarly, when the SSD 3-2 receives the second storage instruction, the updated address translation information which has not been written in the NAND flash memory 5 within the SSD 3-2 is stored in the NAND flash memory 5 (step S318). When the storing of the updated address translation information is completed, the SSD 3-2 transmits the second storage completion notification indicating that the storing of the updated address translation information is completed to the host computer 2.

The processor 40 of the host computer 2 determines whether or not the second storage completion notifications are received from all storage devices (in this example, SSD 3-1 and SSD 3-2) within the first group (step S319). When the second storage completion notifications are received from all storage devices (in this example, SSD 3-1 and SSD 3-2) within the first group (YES of step S319), the processor 40 transmits the second storage instructions to the remaining storage devices (in this example, SSD 3-3 and SSD 3-4).

When the SSD 3-3 receives the second storage instruction, the updated address translation information which has not been written in the NAND flash memory 5 within the SSD 3-3 is stored in the NAND flash memory 5 (step S320). When the storing of the updated address translation information is completed, the SSD 3-3 transmits the second storage completion notification indicating that the storing of the updated address translation information is completed to the host computer 2.

Similarly, when the SSD 3-4 receives the second storage instruction, the updated address translation information which has not been written in the NAND flash memory 5 within the SSD 3-4 is stored in the NAND flash memory 5 (step S321). When the storing of the updated address translation information is completed, the SSD 3-4 transmits the second storage completion notification indicating that the storing of the updated address translation information is completed to the host computer 2.

Figure 10:
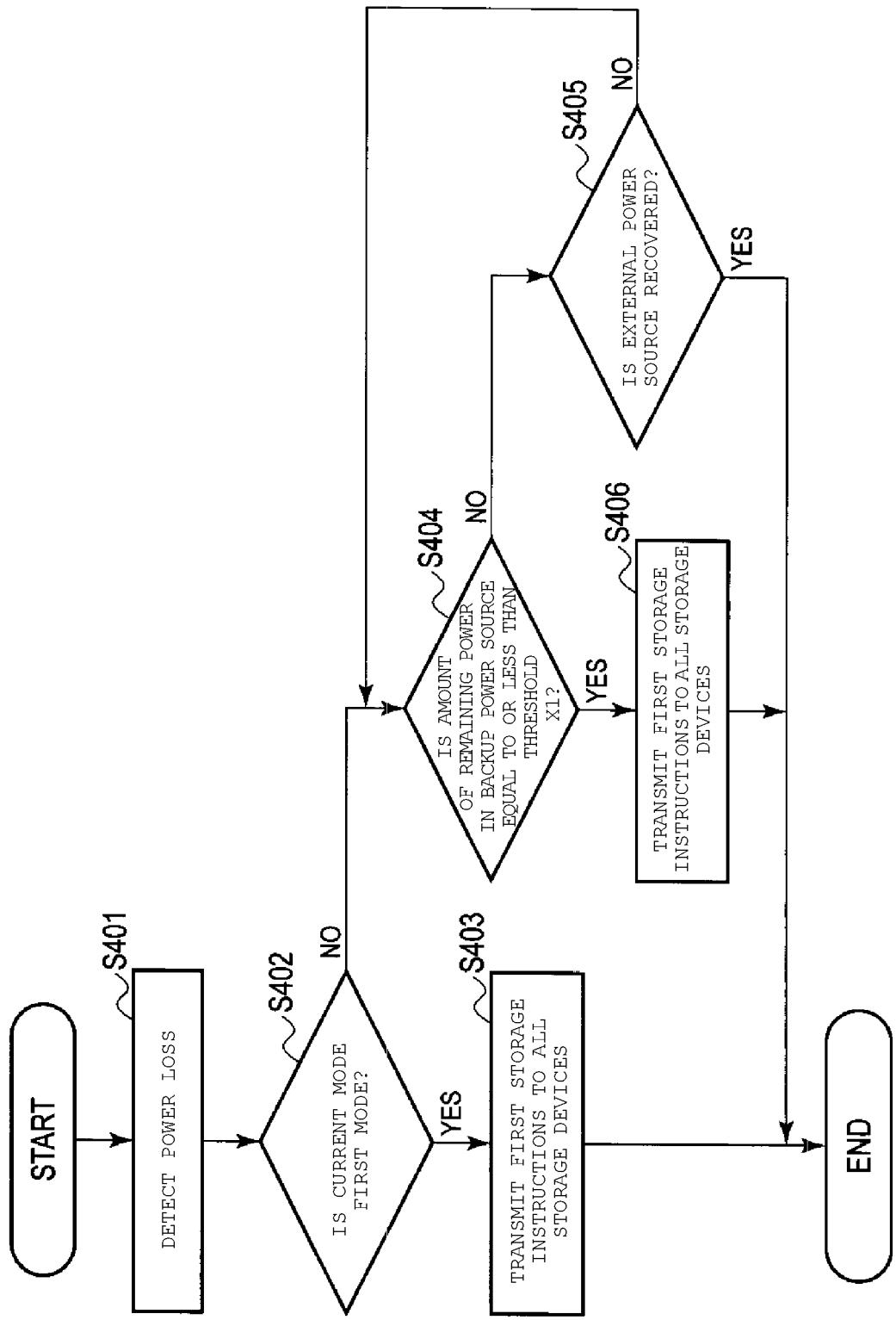
FIG. 10 is a flowchart showing a process procedure of transmitting first storage instructions, which is performed by the host computer.

A flowchart of FIG. 10 shows a procedure of a process of transmitting the first storage instructions performed by the host computer 2.

When the processor 40 of the host computer 2 detects the event of the power loss (step S401), the processor 40 determines whether a current instruction mode is a first mode or a second mode (step S402).

The first mode is a mode in which the first storage instructions are transmitted to all storage devices immediately after the event of the power loss is detected. The second mode is a mode in which the first storage instructions are transmitted to all storage devices when the amount of remaining power in the backup power source 44 is equal to or less than a threshold. When the external power source 50 is recovered before the amount of remaining power in the backup power source 44 is equal to or less than the threshold, the first storage instruction is not transmitted to any storage device. Accordingly, when an instantaneous power loss occurs, since the first storage instruction is not transmitted to any storage device, each storage device is able to continue the normal operation.

When the current instruction mode is the first mode (YES of step S402), the processor 40 transmits the first storage instructions to all storage devices (step S403).

When the current instruction mode is not the first mode, that is, when the current instruction mode is the second mode (NO of step S402), the processor 40 determines whether or not the external power source 50 is recovered before the amount of remaining power in the backup power source 44 is equal to or less than a threshold X1 (steps S404 and S405). When the external power source 50 is recovered before the amount of remaining power in the backup power source 44 is equal to or less than the threshold X1 (YES of step S405), the processor 40 ends the process. When the external power source 50 is not recovered before the amount of remaining power in the backup power source 44 is equal to or less than the threshold X1 (NO of step S405) and the amount of remaining power in the backup power source 44 is equal to or less than the threshold X1 (YES of step S404), the processor 40 transmits the first storage instructions to all the storage devices (step S406).

Figure 11:
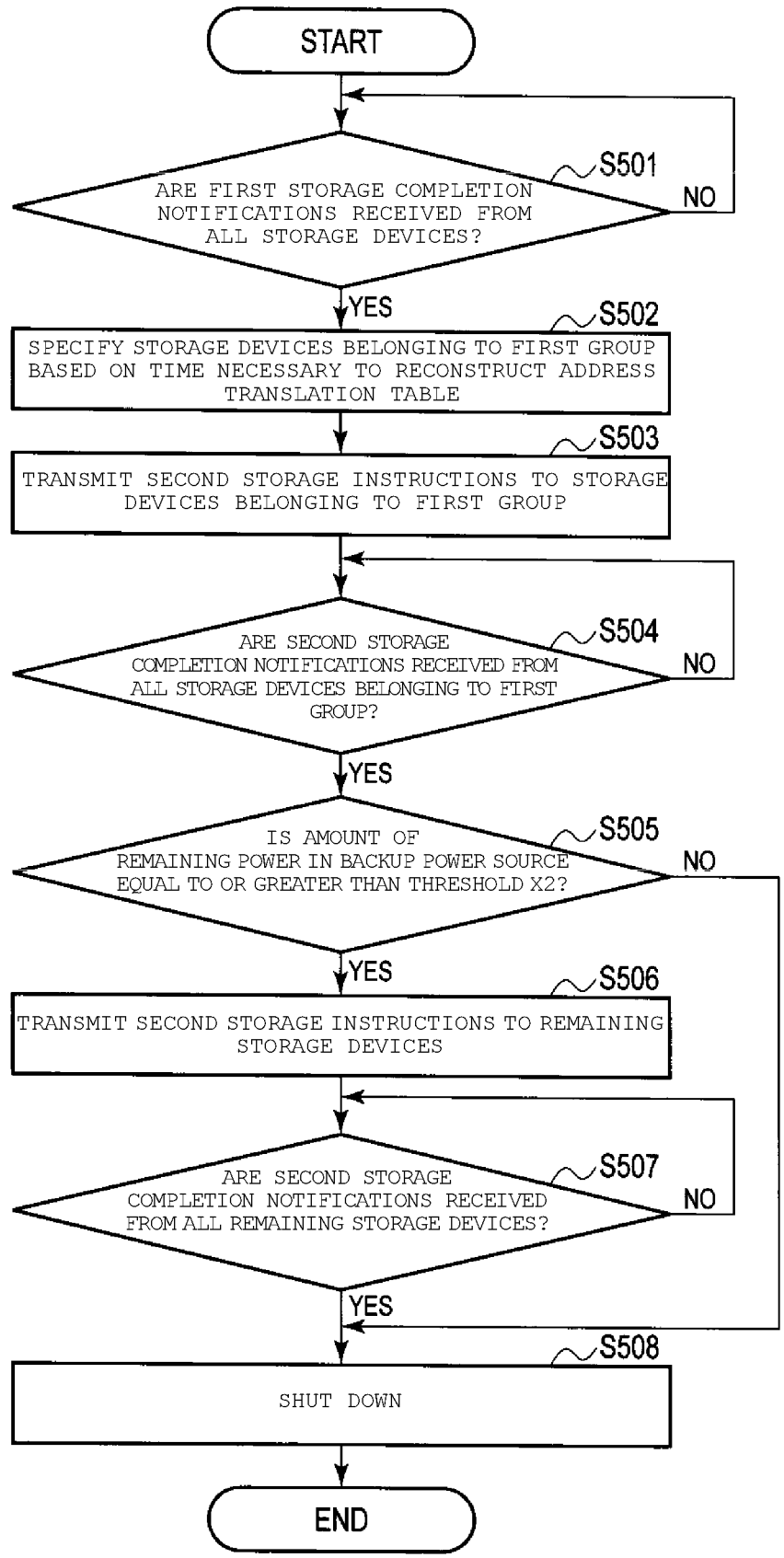
FIG. 11 is a flowchart showing a process procedure of transmitting second storage instructions, which is performed by the host computer.

A flowchart of FIG. 11 shows a procedure of a process of transmitting the second storage instructions performed by the host computer 2.

When the processor 40 of the host computer 2 receives the first storage completion notifications from all storage devices (YES of step S501), the processor 40 specifies the storage devices belonging to the first group based on the time necessary to reconstruct the address translation table (LUT) 32 (step S502). In step S502, the processor 40 determines one or more storage devices (one or more SSDs) of which the time necessary to reconstruct the address translation table (LUT) 32 is longer, as the storage devices belonging to the first group, based on the storage capacitance and the address translation management size corresponding to the storage devices (in this example, SSDs 3-1 to 3-5).

The processor 40 transmits the second storage instructions to the storage devices belonging to the first group (step S503).

Subsequently, the processor 40 determines whether or not the second storage completion notifications are received from all storage devices belonging to the first group (step S504).

When the second storage completion notifications are received from all storage devices belonging to the first group (YES of step S504), the processor 40 determines whether or not the amount of remaining power (for example, remaining capacitance) in the backup power source 44 is equal to or greater than a threshold X2 (<X1) (step S505).

When the amount of remaining power in the backup power source 44 is less than the threshold X2 (NO of step S505), the processor 40 performs a process of shutting the host computer 2 down without transmitting the second storage instruction to all remaining storage devices (i.e., storage devices other than the storage devices belonging to the first group) (step S508). Accordingly, the host computer 2 enters a powered-off state, and the storage devices also enter a powered-off state.

When the amount of remaining power in the backup power source 44 is equal to or greater than the threshold X2 (YES of step S505), the processor 40 transmits the second storage instructions to all remaining storage devices (step S506). The processor 40 determines whether or not the second storage completion notifications are received from all remaining storage devices (step S507).

When the second storage completion notifications are received from all remaining storage devices (YES of step S507), the processor 40 performs a process of shutting the host computer 2 down (step S508).

Figure 12:
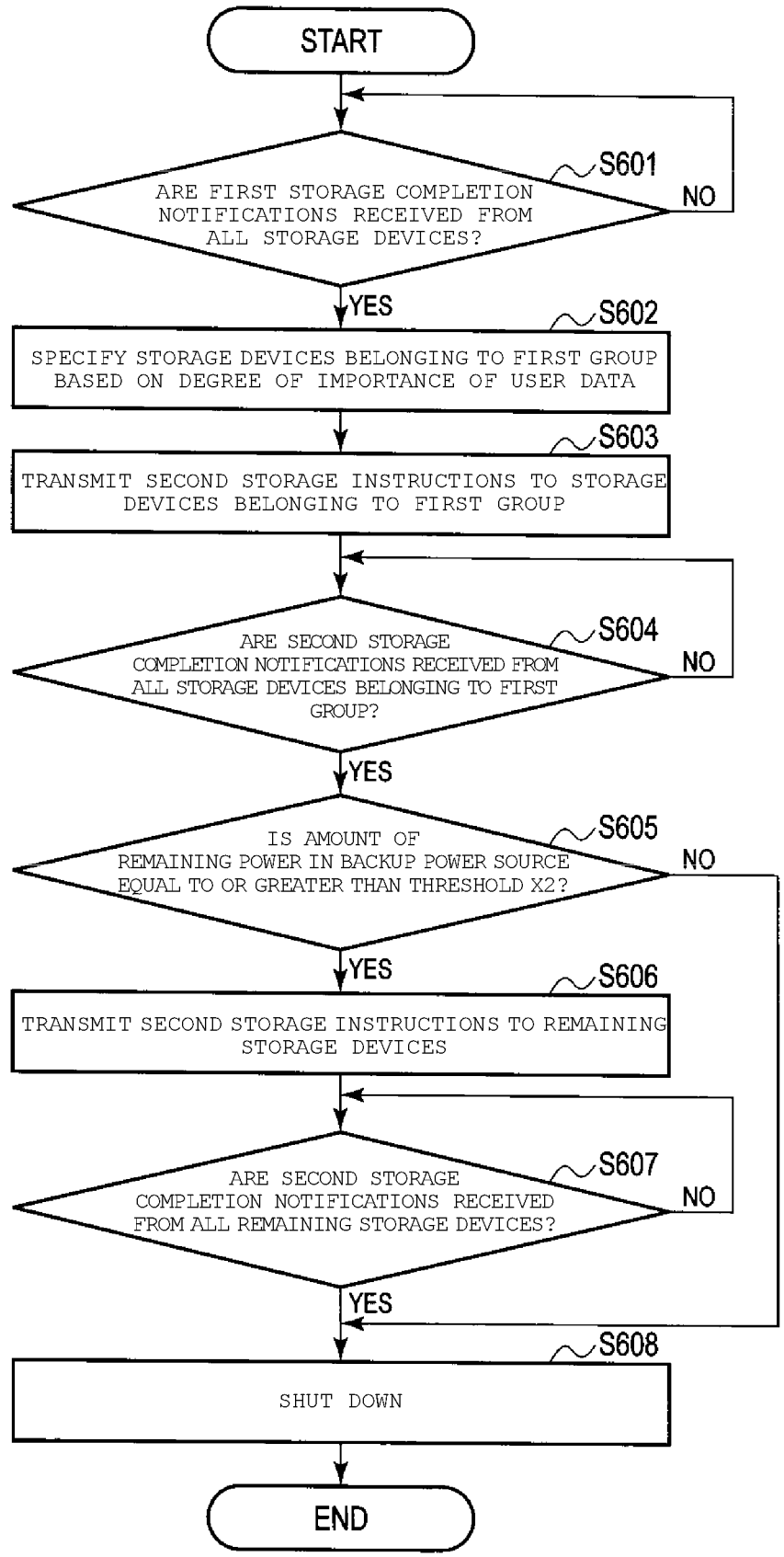
FIG. 12 is a flowchart showing another process procedure of transmitting the second storage instructions, which is performed by the host computer.

A flowchart of FIG. 12 shows another procedure of the process of transmitting the second storage instructions performed by the host computer 2.

When the processor 40 of the host computer 2 receives the first storage completion notifications from all storage devices (YES of step S601), the processor 40 specifies the storage devices belonging to the first group based on the degrees of importance of the stored user data (step S602). In step S602, the processor 40 determines one or more storage devices (e.g., one or more SSDs) that store the user data each having a higher degree of importance, as the storage devices belonging to the first group.

The processor 40 transmits the second storage instructions to the storage devices belonging to the first group (step S603).

Subsequently, the processor 40 determines whether or not the second storage completion notifications are received from all storage devices belonging to the first group (step S604).

When the second storage completion notifications are received from all storage devices belonging to the first group (YES of step S604), the processor 40 determines whether or not the amount of remaining power (for example, the remaining capacitance) in the backup power source 44 is equal to or greater than threshold X2 (<X1) (step S605).

When the amount of remaining power in the backup power source 44 is less than the threshold X2 (NO of step S605), the processor 40 performs a process of shutting the host computer 2 down without transmitting the second storage instructions to all remaining storage devices (storage devices other than the storage devices belonging to the first group) (step S608). Accordingly, the host computer 2 enters a powered-off state, and the storage devices also enter a powered-off state.

When the amount of remaining power in the backup power source 44 is equal to or greater than the threshold X2 (YES of step S605), the processor 40 transmits the second storage instructions to all remaining storage devices (step S606). The processor 40 determines whether or not the second storage completion notifications are received from all remaining storage devices (step S607).

When the second storage completion notifications are received from all remaining storage devices (YES of step S607), the processor 40 performs a process of shutting the host computer 2 down (step S608).

In step S602, one or more storage devices (one or more SSDs) that store the user data each having a high access frequency may be determined as the storage devices belonging to the first group.

Figure 13:
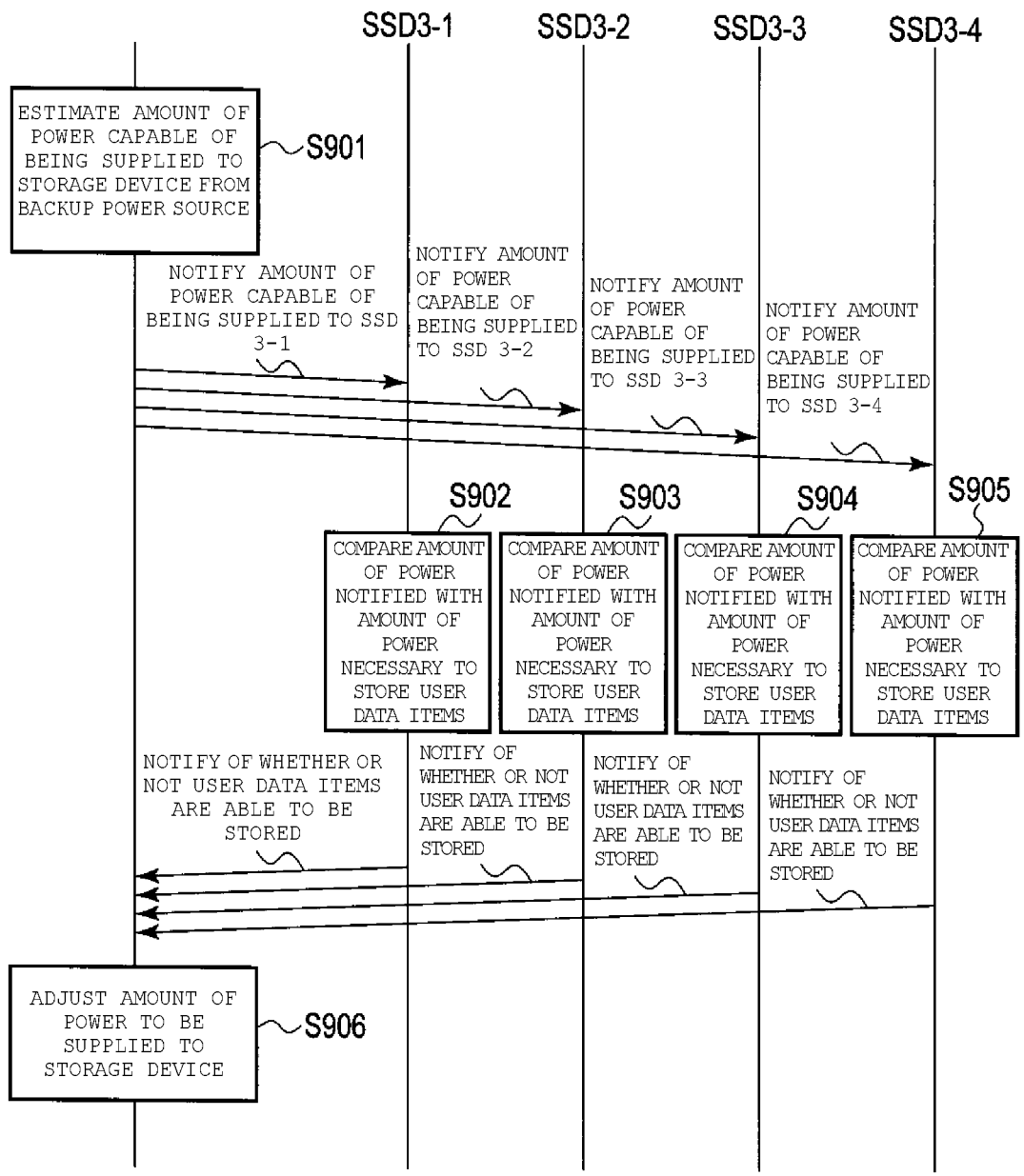
FIG. 13 illustrates a process sequence of processes performed by the host computer and the plurality of SSDs for a normal operation period before an event of a power loss occurs.

FIG. 13 is a process sequence performed by the host computer 2 and the SSDs 3-1 to 3-5 for the normal operation period before the event of the power loss occurs.

The processor 40 of the host computer 2 estimates the amount of power capable of being supplied to the storage devices (in this example, SSDs 3-1 to 3-5) from the backup power source 44 for the normal operation period before the event of the unexpected power loss occurs (step S901). The amount of power may be estimated for every storage device. The processor 40 notifies the storage device of the amount of power estimated.

When the notification of the amount of power capable of being supplied to the SSD 3-1 is received, the controller 4 of the SSD 3-1 compares the amount of power notified with the amount of power necessary to store the user data (step S902). The amount of power necessary to store the user data may be estimated based on the maximum amount of user data capable of being accumulated in the write buffer (WB) 31. In general, as the maximum amount of user data capable of being accumulated in the write buffer (WB) 31 becomes larger, the writing capabilities are improved. This is because the data write operations for the plurality of NAND flash memory chips can be performed in parallel.

When the amount of power notified is equal to or greater than the amount of power necessary to store the user data, the controller 4 of the SSD 3-1 determines that the user data are able to be stored with the backup power supplied from the host computer 2. When the amount of power notified is less than the amount of power necessary to store the user data, the controller 4 of the SSD 3-1 determines that the user data are not able to be stored with the backup power supplied from the host computer 2. The controller 4 of the SSD 3-1 notifies the host computer 2 of whether or not the user data are able to be stored.

Similarly, when the notification of the amount of power capable of being supplied to the SSD 3-2 is received, the SSD 3-2 compares the amount of power notified with the amount of power necessary to store the user data (step S903). In this example, it is determined whether or not the user data are able to be stored with the amount of power notified. The SSD 3-2 notifies the host computer 2 of whether or not the user data are able to be stored.

Similarly, when the notification of the amount of power capable of being supplied to the SSD 3-3 is received, the SSD 3-3 compares the amount of power notified with the amount of power necessary to store the user data (step S904). In this example, it is determined whether or not the user data are able to be stored with the amount of power notified. The SSD 3-3 notifies the host computer 2 of whether or not the user data are able to be stored.

Similarly, when the notification of the amount of power capable of being supplied to the SSD 3-4 is received, the SSD 3-4 compares the amount of power notified with the amount of power necessary to store the user data (step S905). In this example, it is determined whether or not the user data are able to be stored with the amount of power notified. The SSD 3-4 notifies the host computer 2 of whether or not the user data are able to be stored.

When the notification indicating whether or not the user data are able to be stored is received from all storage devices, the processor 40 of the host computer 2 adjusts the amount of power to be supplied to each of the storage devices (step S906).

When the processor 40 of the host computer 2 receives the notifications indicating that the user data are able to be stored from the SSD 3-2 to SSD 3-4 and receives the notification indicating that the user data are not able to be stored from the SSD 3-1, the processor 40 may adjust the amount of power such that the amount of power to be supplied to the SSD 3-1 is increased and the amount of power to be applied to the SSD 3-2 to SSD 3-4 is decreased.

Although FIG. 13 describes that the amount of power capable of being supplied after the power loss is notified to all storage devices, the processor 40 of the host computer 2 may notify all storage devices of a period during which the power is able to be supplied after the power loss. Each storage device may determine whether or not the user data are able to be stored in the NAND flash memory 5 based on the notified period.

Figure 14:
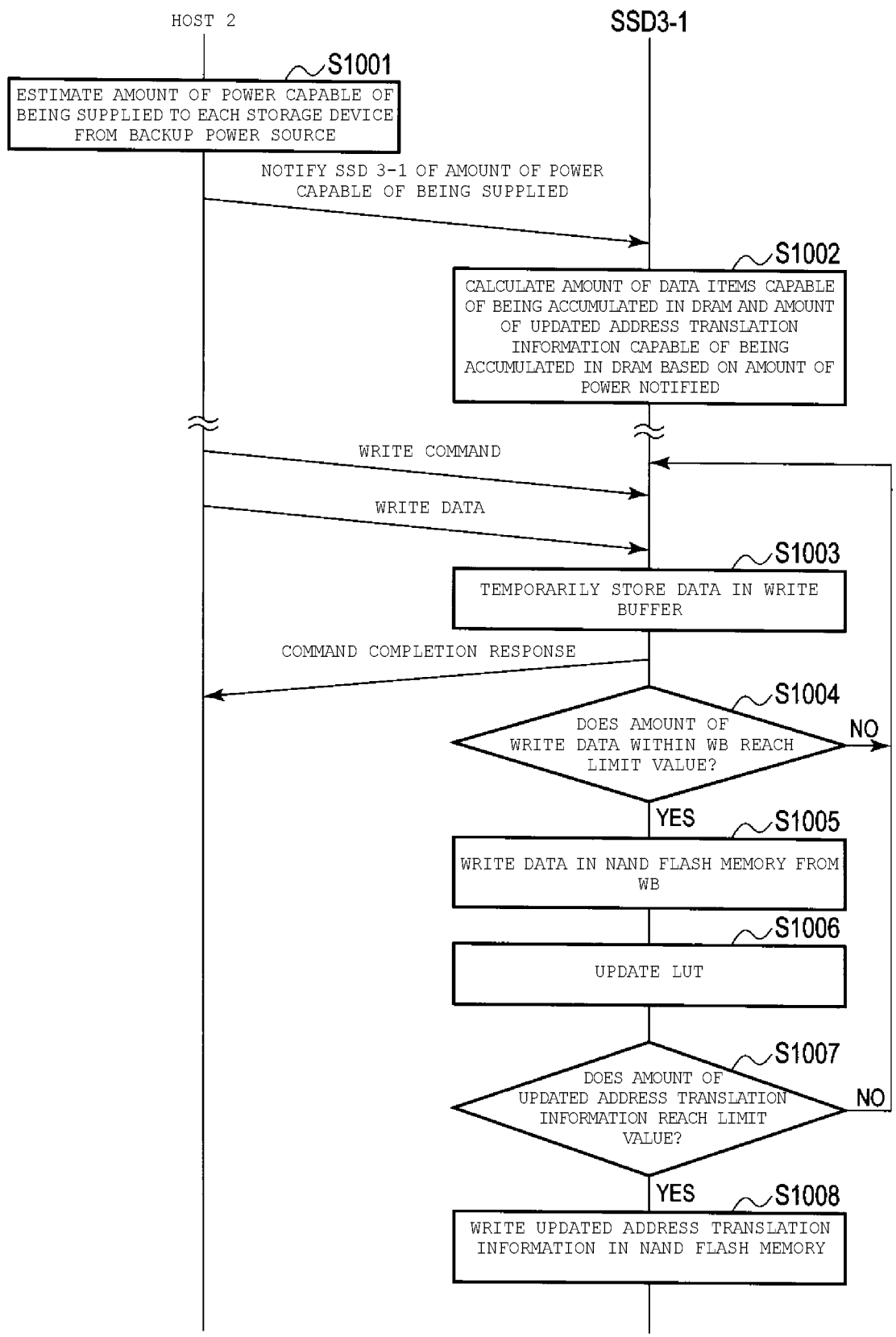
FIG. 14 illustrates a process sequence of restricting the amount of user data and the amount of updated address translation information which are capable of being accumulated in a volatile memory within the SSD.

FIG. 14 shows a process sequence for restricting the amount of unwritten user data capable of being accumulated in the DRAM 6 within the SSD 3-1 and the amount of unwritten updated address translation information capable of being accumulated in the DRAM 6.

The processor 40 of the host computer 2 estimates the amount of power capable of being supplied to the storage devices (in this example, SSDs 3-1 to 3-5) from the backup power source 44 for the normal operation period before the event of the unexpected power loss (step S1001). The processor 40 notifies the storage device of the amount of power estimated.

When the notification of the amount of power capable of being supplied to the SSD 3-1 is received, the controller 4 of the SSD 3-1 calculates the amount of unwritten user data capable of being accumulated in the DRAM 6 and the amount of unwritten updated address translation information capable of being accumulated in the DRAM 6 based on the amount of power notified (step S1002).

Thereafter, when the controller 4 of the SSD 3-1 receives the write command from the host computer 2 and further receives the write data from the host computer 2, the controller 4 of the SSD 3-1 temporarily stores the received write data in the write buffer 31 (step S1003). When the write data is stored in the write buffer 31, the controller 4 of the SSD 3-1 returns the response of the command completion to the host computer 2.

Subsequently, the controller 4 determines whether or not the amount of unwritten write data stored in the write buffer 31 reaches a limit value (step S1004). The limit value indicates the amount of unwritten user data capable of being accumulated in the DRAM 6 which is calculated in step S1002. The controller 4 may accumulate new write data received from the host computer 2 in the write buffer 31 without writing the write data within the write buffer 31 in the NAND flash memory 5 until the amount of unwritten write data stored in the write buffer 31 reaches the limit value.

When the amount of unwritten write data stored in the write buffer 31 reaches the limit value (YES of step S1004), the controller 4 writes the write data within the write buffer 31 in the NAND flash memory 5 (step S1005). The controller 4 updates the LUT 32, and maps the physical address indicating the physical storage position in which the write data is written to the LBA corresponding to the write data (step S1006).

Subsequently, the controller 4 determines whether or not the amount of updated address translation information within the LUT 32 reaches the limit value (step S1007). The limit value indicates the amount of unwritten updated address translation information capable of being accumulated in the DRAM 6 which is calculated in step S1002. The controller 4 may continue to update the LUT 32 without writing the unwritten updated address translation information in the NAND flash memory 5 until the amount of unwritten updated address translation information within the LUT 32 reaches the limit value.

When the amount of unwritten updated address translation information reaches the limit value (YES of step S1007), the controller 4 writes the unwritten updated address translation information in the NAND flash memory 5 (step S1008).

Although it has been described in FIG. 14 that both the amount of unwritten user data capable of being accumulated in the DRAM 6 and the amount of unwritten updated address translation information capable of being accumulated in the DRAM 6 are restricted, only the amount of unwritten user data capable of being accumulated in the DRAM 6 may be restricted based on the amount of power notified.

Hereinafter, a process of reconstructing the address translation table will be described with reference to FIGS. 15 and 16.

Figure 15:
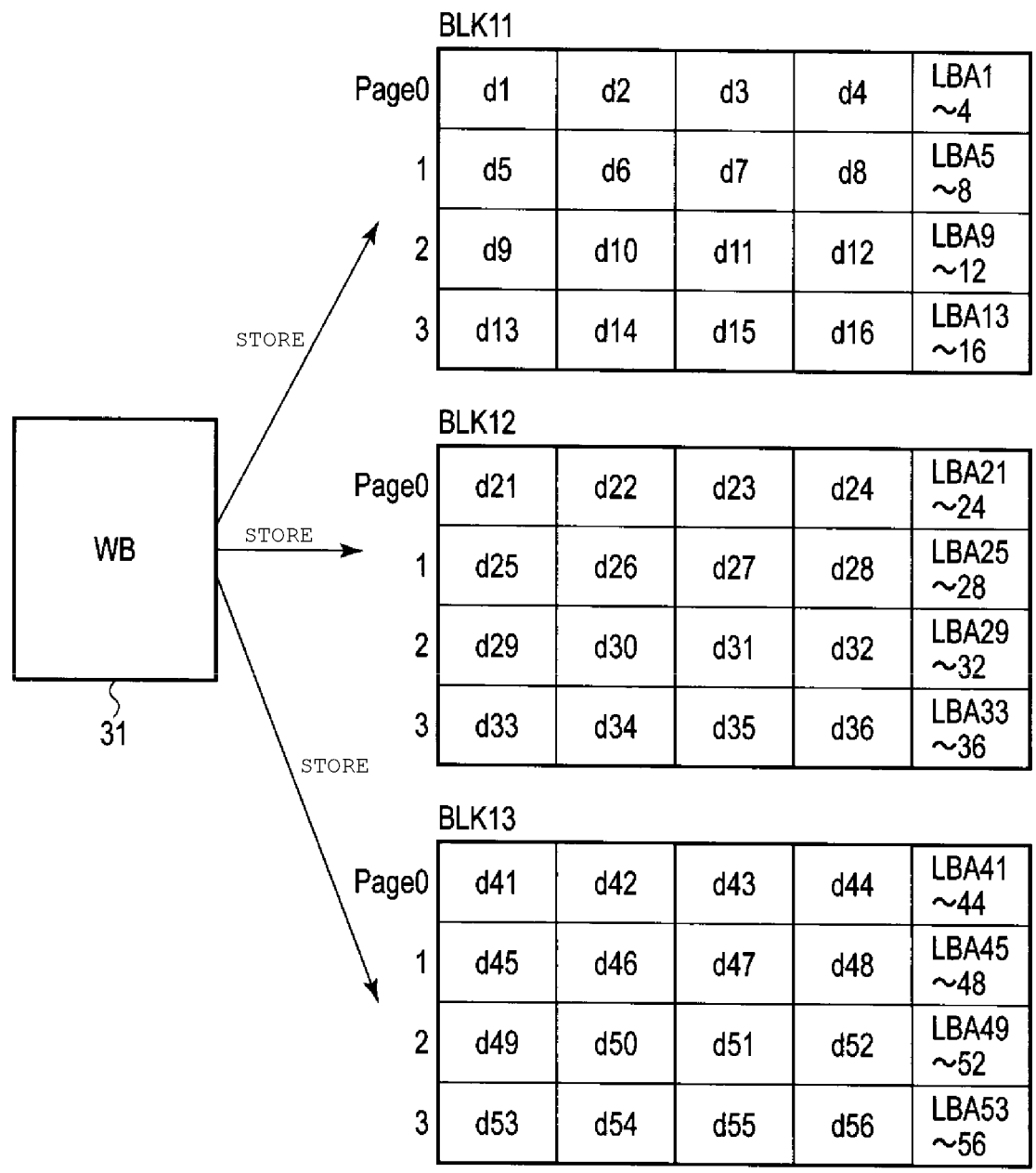
FIG. 15 illustrates an operation for storing user data which are not written in the non-volatile memory in a plurality of blocks of the non-volatile memory.

FIG. 15 shows an operation for storing user data which have not been written in the NAND flash memory 5 in a plurality of blocks BLK11 to BLK13 of the NAND flash memory 5.

When the first storage instruction is received from the host computer 2, the controller 4 stores the user data within the write buffer 31 which have not been written in the NAND flash memory 5 and the address information (LBAs of the user data) for reconstructing the LUT 32 in the NAND flash memory 5.

In FIG. 15, in the BLK11, user data d1 to d4 and LBAs 1 to 4 corresponding to the user data d1 to d4 are written in page 0, user data d5 to d8 and LBAs 5 to 8 corresponding to the user data d5 to d8 are written in page 1, user data d9 to d12 and LBAs 9 to 12 corresponding to the user data d9 to d12 are written in page 2, and user data d13 to d16 and LBAs 13 to 16 corresponding to the user data d13 to d16 are written in page 3.

In the BLK12, user data d21 to d24 and LBAs 21 to 24 corresponding to the user data d21 to d24 are written in page 0, user data d25 to d28 and LBAs 25 to 28 corresponding to the user data d25 to d28 are written in page 1, user data d29 to d32 and LBAs 29 to 32 corresponding to the user data d29 to d32 are written in page 2, and user data d33 to d36 and LBAs 33 to 36 corresponding to the user data d33 to d36 are written in page 3.

In the BLK13, user data d41 to d44 and LBAs 41 to 44 corresponding to the user data d41 to d44 are written in page 0, user data d45 to d48 and LBAs 45 to 48 corresponding to the user data d45 to d48 are written in page 1, user data d49 to d52 and LBAs 49 to 52 corresponding to the user data d49 to d52 are written in page 2, and user data d53 to d56 and LBAs 53 to 56 corresponding to the user data d53 to d56 are written in page 3.

FIG. 16 shows an example of an operation for reconstructing the address translation table.

The address translation table retains the physical addresses which respectively correspond to the plurality of LBAs. The controller 4 of the SSD 3-1 reads address information (LBAs) for the reconstruction of the address translation table which are stored in pages within each block that stores the user data.

For example, the controller 4 reads the LBAs 1 to 4 from the page 0 of the block BLK11, changes the physical address corresponding to the LBA 1 to a physical address (BLK11, Page0, Offset0) indicating a physical storage position in which the data d1 is stored, changes the physical address corresponding to the LBA 2 to a physical address (BLK11, Page0, Offset1) indicating a physical storage position in which the data d2 is stored, changes the physical address corresponding to the LBA 3 to a physical address (BLK11, Page0, Offset2) indicating a physical storage position in which the data d3 is stored, and changes the physical address corresponding to the LBA 4 to a physical address (BLK11, Page0, Offset3) indicating a physical storage position in which the data d3 is stored.

Subsequently, the controller 4 reads the LBAs 5 to 8 from the page 1 of the block BLK11, changes the physical address corresponding to the LBA 5 to a physical address (BLK11, Page1, Offset0) indicating a physical storage position in which the data d5 is stored, changes the physical address corresponding to the LBA 6 to a physical address (BLK11, Page1, Offset1) indicating a physical storage position in which the data d6 is stored, changes the physical address corresponding to the LBA 7 to a physical address (BLK11, Page1, Offset2) indicating a physical storage position in which the data d7 is stored, and changes the physical address corresponding to the LBA 8 to a physical address (BLK11, Page1, Offset3) indicating a physical storage position in which the data d8 is stored.

Subsequently, the controller 4 reads the LBAs 9 to 12 from the page 2 of the block BLK11, changes the physical address corresponding to the LBA 9 to a physical address (BLK11, Page2, Offset0) indicating a physical storage position in which the data d9 is stored, changes the physical address corresponding to the LBA 10 to a physical address (BLK11, Page2, Offset1) indicating a physical storage position in which the data d10 is stored, changes the physical address corresponding to the LBA 11 to a physical address (BLK11, Page2, Offset2) indicating a physical storage position in which the data d11 is stored, and changes the physical address corresponding to the LBA 12 to a physical address (BLK11, Page2, Offset3) indicating a physical storage position in which the data d12 is stored.

Subsequently, the controller 4 reads the LBAs 13 to 16 from the page 3 of the block BLK11, changes the physical address corresponding to the LBA 13 to a physical address (BLK11, Page3, Offset0) indicating a physical storage position in which the data d13 is stored, changes the physical address corresponding to the LBA 14 to a physical address (BLK11, Page3, Offset1) indicating a physical storage position in which the data d14 is stored, changes the physical address corresponding to the LBA 15 to a physical address (BLK11, Page3, Offset2) indicating a physical storage position in which the data d15 is stored, and changes the physical address corresponding to the LBA 16 to a physical address (BLK11, Page3, Offset3) indicating a physical storage position in which the data d16 is stored.

Similarly, the controller 4 reads LBAs 21 to 36 stored in the block BLK12, and changes the physical addresses corresponding to the LBAs 21 to 36 to physical addresses indicating physical storage positions in which data d21 to d36 are stored.

The controller 4 reads LBAs 41 to 56 stored in the block BLK13, and changes physical addresses corresponding to the LBAs 41 to 56 to physical addresses indicating physical storage positions in which the data d41 to d56 are stored.

Figure 17:
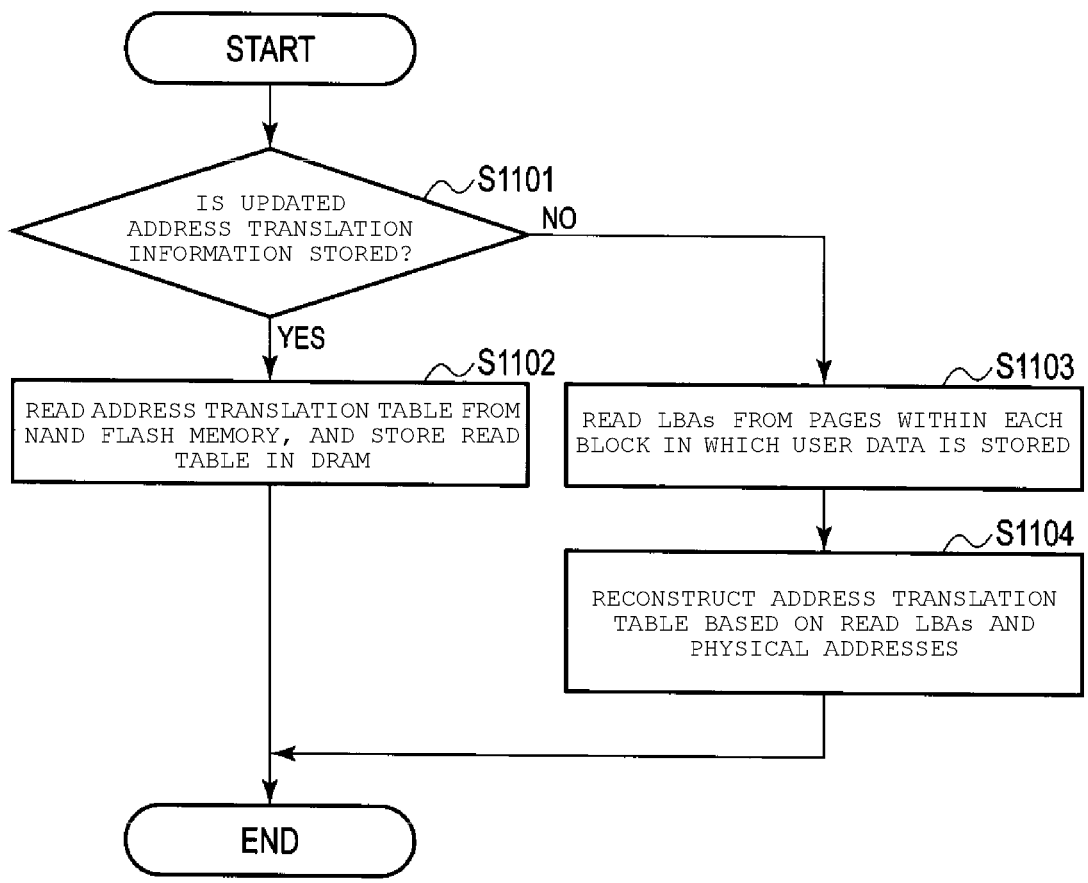
FIG. 17 is a flowchart showing a procedure of an address translation table reconstruction process performed by the SSD.

A flowchart of FIG. 17 shows a procedure of a process of reconstructing the address translation table 32 performed by the SSD 3-1.

When the power supplied to the SSD 3-1 from the host computer 2 is recovered, the controller 4 of the SSD 3-1 determines whether or not the second storage operation (the storing of updated address translation information) is completed when the power loss occurs (step S1101). When the updated address translation information are stored in the NAND flash memory 5 (YES of step S1101), the controller 4 reads all or a part of the address translation table on which the updated address translation information are reflected from the NAND flash memory 5, and stores all or a part of the address translation table as the lookup table (LUT) 32 in the DRAM 6 (step S1102).

When the updated address translation information is not stored in the NAND flash memory 5 (NO of step S1101), the controller 4 reads the address information (LBAs) for the reconstruction of the address translation table which are stored in the pages within each block that stores the user data (step S1103). The controller 4 reconstructs the address translation table based on the read LBAs and the physical addresses of the pages corresponding to the LBAs (step S1104). When the LBA list is stored in the last page of each block, the controller 4 may reconstruct the address translation table by using the LBA list of each block.

Although it has been described above that the SSDs 3-1 to 3-5 are used as the plurality of storage devices capable of being connected to the host computer 2, these storage devices may be hard disk drives (HDDs) using the shingled magnetic recording (SMR) technology as mentioned above.

Figure 18:
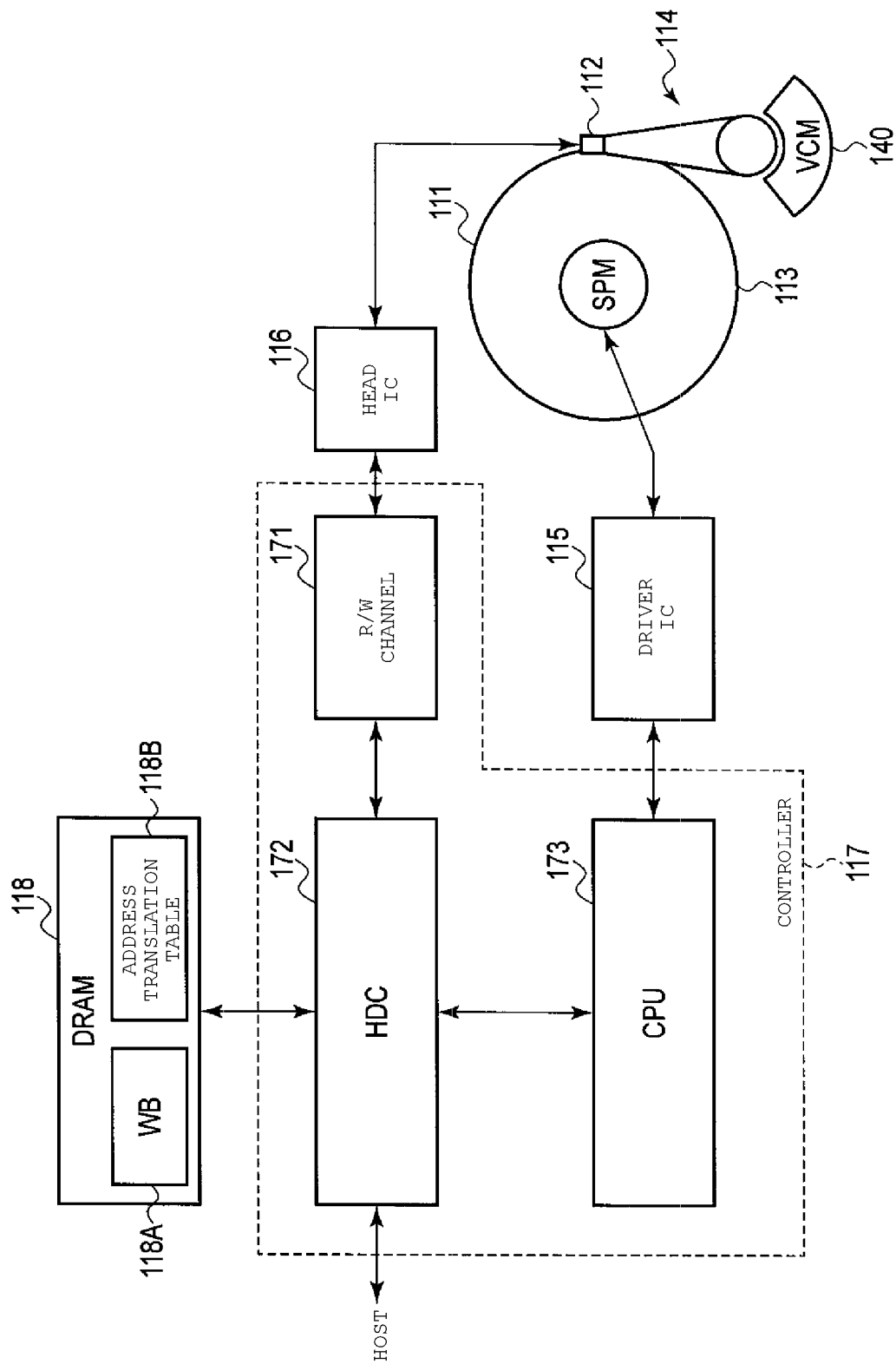
FIG. 18 illustrates a configuration example of an HDD capable of being connected to the host computer.

FIG. 18 shows a configuration example of the hard disk drive (HDD) using the SMR technology.

The HDD shown in FIG. 18 includes a magnetic disk 111, a magnetic head 112, a spindle motor (SPM) 113, an actuator 114, a driver IC 115, a head IC 116, a controller 117, and a DRAM 118.

In the HDD, an addressing scheme in which the physical positions (for example, sector positions) on the disk 111 which are allocated to the logical addresses are not fixed is applied.

For example, the disk 111 is a non-volatile storage medium of which a recording surface on which the magnetic recording of data is performed is formed on one surface. The disk 111 is rotated by the SPM 113 at a high speed. The SPM 113 is driven by a drive current (or voltage) to be supplied from the driver IC 115. For example, the disk 111 (more specifically, the recording surface of the disk 111) is divided into a plurality of concentric storage areas. That is, the disk 111 includes the plurality of concentric storage areas. It is assumed that the number of storage areas is n. Each of n storage areas is generally called a zone, and includes a plurality of tracks. For example, each zone is used as a data write-once access area. That is, the data is rewritten in every zone on the disk 111. The data is erased from every zone.

The head 112 is disposed so as to corresponding to the recording surface of the disk 111. The head 112 includes a read element to be used to read data from the disk 111 and a write element to be used to write data in the disk 111. The read element and the write element are called a reader and a writer, respectively. It is assumed that a width of the write element is greater than a width of the read element. The shingled magnetic recording (SMR) is used in the writing of data in the zone on the disk 111. In the shingled magnetic recording, the data are sequentially written from the first track of the zone to the last track thereof. The write element (e.g., head 112) is moved in a radial direction of the disk 111 by a pitch corresponding to a read track traced by the read element whenever data as much as one track are written in the zone.

The head 112 is attached to a front end of the actuator 114. The disk 111 rotates at a high speed, and thus, the head 112 moves above the disk 111. The actuator 114 includes a voice coil motor (VCM) 140 which is a driving source of the actuator 114. The VCM 140 is driven by a drive current (or voltage) to be supplied from the driver IC 115. The actuator 114 is driven by the VCM 140, and thus, the head 112 is moved in an arc on the disk 111 in the radial direction of the disk 111.

Unlike the configuration shown in FIG. 18, the HDD may include a plurality of disks. The disk 111 shown in FIG. 18 may include recording surfaces on both surfaces, and heads may be disposed on the recording surfaces, respectively.

The driver IC 115 drives the SPM 113 and the VCM 140 according to the control of the controller 117 (more specifically, a CPU 173 of the controller 117). The head IC 116 includes a read amplifier, and amplifies a signal (that is, reproduction signal) reproduced by the head 112. The head IC 116 further includes a write driver. The head IC converts the write data sent from an R/W channel 171 within the controller 117 into a write current, and sends the write current to the head 112.

For example, the controller 117 is configured with large scale integration (LSI) called system-on-a-chip (SOC) that integrates a plurality of elements on a single chip. The controller 117 includes a read/write (R/W) channel 171, a hard disk controller (HDC) 172, and a CPU 173.

The R/W channel 171 processes signals related to read/write. The R/W channel 171 converts the reproduction signal (also known as a read signal) into digital data by an analog-to-digital converter, and decodes read data from the digital data. The R/W channel 171 extracts servo data necessary to position the head 112 from the digital data. The R/W channel 171 encodes the write data.

The HDC 172 is connected to the host. The HDC 172 receives the commands (e.g., a write command, a read command, and the like) transmitted from the host. The HDC 172 controls data transmission between the host and the DRAM 118 and data transmission between the DRAM 118 and the R/W channel 171.

The CPU 173 functions as a main controller of the HDD shown in FIG. 18. The CPU 173 controls at least some elements within the HDD including the HDC 172 according to the control program.

A part of the storage area of the DRAM 118 is used as a write buffer (WB) 118A for temporarily storing the write data received from the host computer 2. Another part of the storage area of the DRAM 118 is used for storing an address translation table 118B. Another part of the storage area of the DRAM 118 may be used for storing various kinds of system management information 33.

The address translation table 118B is used for managing the correspondence between the logical addresses and the physical addresses for every sector in which data is written. In this example, it is assumed that a new write operation is performed in a zone of data corresponding to a certain logical address (for example, LBA). In this case, the data is written in an empty zone without being written in the zone corresponding to the LBA. The HDC 172 updates information indicating the correspondence between the LBAs and the physical addresses in the address translation table 118B when the writing of the data in the zone is completed.

Figure 19:
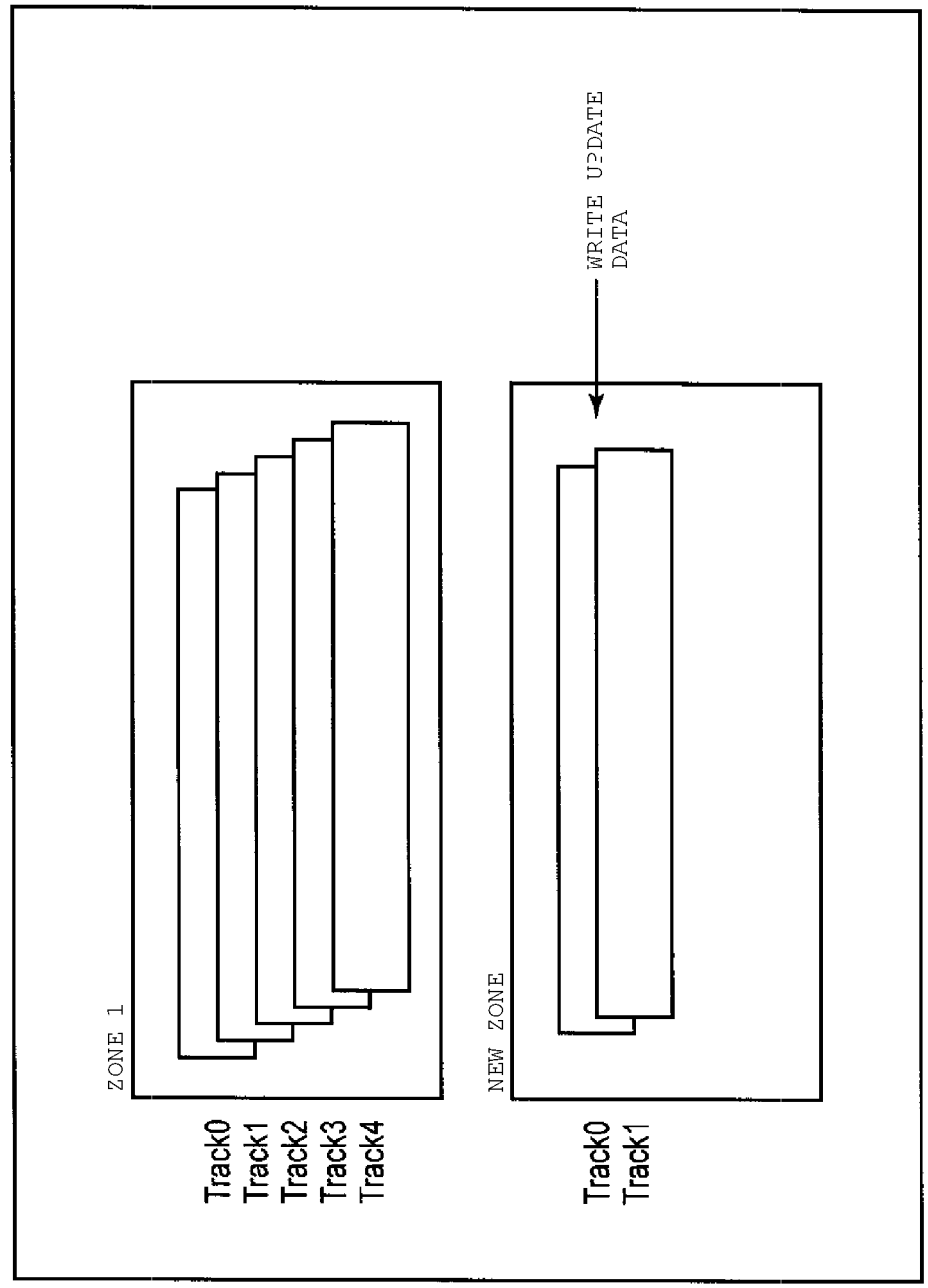
FIG. 19 illustrates an update data write operation performed by the HDD of FIG. 18.

FIG. 19 shows the write operation of the update data.

In FIG. 19, two zones are depicted for simplicity of illustration. Each zone includes a plurality of tracks (for example, Tracks 0 to 4).

When a part of the user data recorded in zone 1 is rewritten, the update data is recorded in a certain new zone which is a zone different from the zone 1. In this case, the address translation table 118B is updated, and a physical address indicating the physical storage position of the update data maps to the LBA corresponding to the data before the updating.

Figure 20:
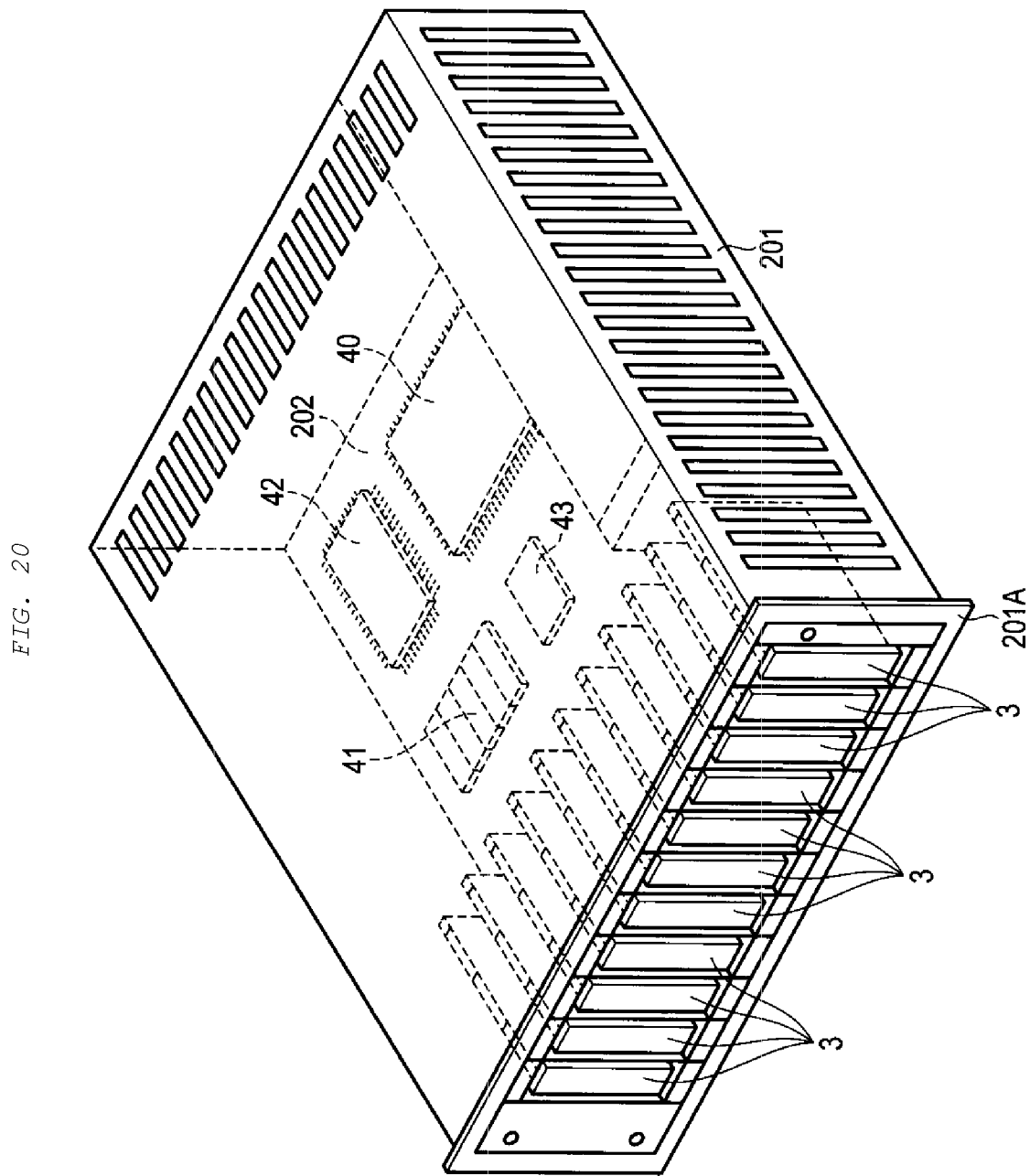
FIG. 20 illustrates a configuration example of a computer functioning as the host computer.

FIG. 20 shows a configuration example of a computer functioning as the host computer 2.

The computer includes a thin box-shaped casing 201 capable of being accommodated in a rack. The plurality of SSDs 3 may be arranged within the casing 201. In this case, each SSD may be detachably inserted into a slot provided in a front surface 201A of the casing 201.

A system board (e.g., motherboard) 202 is disposed within the casing 201. Various electronic components including the processor 40, the memory 41, the system controller 42, and the power source circuit 43 are mounted on the system board 202. These electronic components function as the host computer 2.

As described above, according to the present embodiment, the host computer 2 transmits the first storage instruction for instructing that the user data which are not written in the non-volatile storage medium such as the NAND flash memory 5 are to be stored in the non-volatile storage medium from the volatile memory such as the DRAM 6 to the plurality of storage devices after the event of the power loss. When the replies indicating that the storing of the user data in the non-volatile storage medium are received from all the plurality of storage devices, the host computer 2 transmits the second storage instructions for instructing that the updated address translation information are to be stored in the non-volatile storage medium from the volatile memory to all storage devices or one or more of storage devices. Accordingly, it is possible to perform transition to an additional storing process of storing the updated address translation information after all storage devices complete the storing of the user data. Thus, it is possible to prevent several storage devices from starting the additional storing process even though there is the storage device that is storing the user data. Therefore, it is possible to greatly reduce a possibility that the backup power from the host computer 2 will be discontinued before a certain storage device completes the storing of the user data.

The host computer 2 can preferentially transmit the second storage instructions to one or more first storage devices of which a time necessary to reconstruct the address translation table is longer. When the replies indicating that the storing of the updated address translation information is completed are received from all of one or more first storage devices, the host computer 2 transmits the second storage instructions to the remaining storage devices. Accordingly, it is possible to shorten a time necessary to when all the storage devices are recovered to the normal operation from when the power recovery is performed.

In the present embodiment, the NAND flash memory is used as the example of the non-volatile memory. However, the function of the present embodiment may be applied to other various non-volatile memories such as a magnetoresistive random-access memory (MRAM), a phase change random access memory (PRAM), a resistive random access memory (ReRAM), and a ferroelectric random access memory (FeRAM).

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A storage device connectable to a host device and operable with power supplied from the host device, the host device including a backup power source, the storage device comprising:
a volatile memory;
a non-volatile storage; and
a controller configured to:
save user data that are stored in the volatile memory and have not been written in the non-volatile storage, in response to a first instruction from the host device that is caused by a power to the host device being interrupted,
manage mapping between logical addresses and physical addresses of the non-volatile storage using an address translation table, and
save updated address translation information that corresponds to the user data and has not been saved in the non-volatile storage, in response to a second instruction from the host device after the first instruction,
wherein saving of the user data and saving of the updated address translation information are to be performed using power supplied from the backup power source of the host device.

2. The storage device according to claim 1, wherein the controller is further configured to transmit a notification indicating completion of saving the user data.

3. The storage device according to claim 1, wherein the controller is further configured to save logical addresses corresponding to the user data in the non-volatile storage in response to the first instruction.

4. The storage device according to claim 3, wherein the non-volatile storage comprises a non-volatile semiconductor memory including a plurality of blocks, a block being a unit of erasure, and
the controller saves the user data in a user data region of one of the blocks, and the logical addresses in a redundancy region of said one of the blocks.

5. The storage device according to claim 4, wherein each of the blocks includes a plurality of pages, a page being a unit of writing, and
the controller saves a part of the user data in a user data region in one of the pages of said one of the blocks, and a part of the logical addresses in a redundancy region in said one of the pages of said one of the blocks.

6. The storage device according to claim 1, wherein the controller is further configured to update the address translation table based on the logical addresses saved in the non-volatile storage and physical addresses of the non-volatile storage at which the logical addresses are saved.

7. The storage device according to claim 1, wherein the controller is further configured to restrict an amount of the updated address translation information to be saved in response to the second instruction, based on a notification that is sent from the host device and indicates an amount of electric power to be supplied during power loss of the host device.

8. The storage device according to claim 1, wherein the controller is further configured to restrict an amount of the user data to be saved in response to the first instruction, based on a notification that is sent from the host device and indicates an amount of electric power to be supplied during power to the host device being interrupted.

9. The information processing device according to claim 1, wherein the storage device is connectable to the host through a connector, and wherein power is supplied from the backup power source to the storage device through the connector.

* * * * *